United States Patent
Karino

(10) Patent No.: US 7,903,713 B2
(45) Date of Patent: Mar. 8, 2011

(54) MULTI-BEAM SEMICONDUCTOR LASER

(75) Inventor: Sachio Karino, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/398,498

(22) Filed: Mar. 5, 2009

(65) Prior Publication Data

US 2009/0245313 A1  Oct. 1, 2009

(30) Foreign Application Priority Data

Mar. 27, 2008 (JP) ................... 2008-082709

(51) Int. Cl.
  *H01S 3/097* (2006.01)
  *H01S 5/00* (2006.01)
(52) U.S. Cl. ........................ 372/50.12; 372/87
(58) Field of Classification Search ............ 372/46.014, 372/46.015, 50.12, 87
  See application file for complete search history.

(56) References Cited

U.S. PATENT DOCUMENTS

2009/0147816 A1 * 6/2009 Iga et al. .................. 372/50.12

FOREIGN PATENT DOCUMENTS

| JP | 03-206678 | | 9/1991 |
|---|---|---|---|
| JP | 06-326420 | | 11/1994 |
| JP | 08-293641 | | 11/1996 |
| JP | 10-070336 | * | 3/1998 |
| JP | 11-354888 | | 12/1999 |
| JP | 2000-216500 | | 8/2000 |
| JP | 2000-269601 | | 9/2000 |
| JP | 2001-274511 | | 10/2001 |
| JP | 2002-057401 | | 2/2002 |
| JP | 2002-164606 | | 6/2002 |
| JP | 2002-324944 | | 11/2002 |
| JP | 2004-193303 | | 7/2004 |
| JP | 2005-045146 | | 2/2005 |
| JP | 2007-095736 | | 4/2007 |

* cited by examiner

*Primary Examiner* — Armando Rodriguez
(74) *Attorney, Agent, or Firm* — SNR Denton US LLP

(57) ABSTRACT

An edge-emitting multi-beam semiconductor laser includes juxtaposed stripe-shaped light-emitting portions the number of which is N (wherein N≧2), wherein a separation groove that electrically separates the light-emitting portions from each other is provided between the light-emitting portions, a first recess that is partly discontinuous is provided outside a first light-emitting portion, a second recess that is partly discontinuous is provided outside an Nth light-emitting portion.

10 Claims, 16 Drawing Sheets

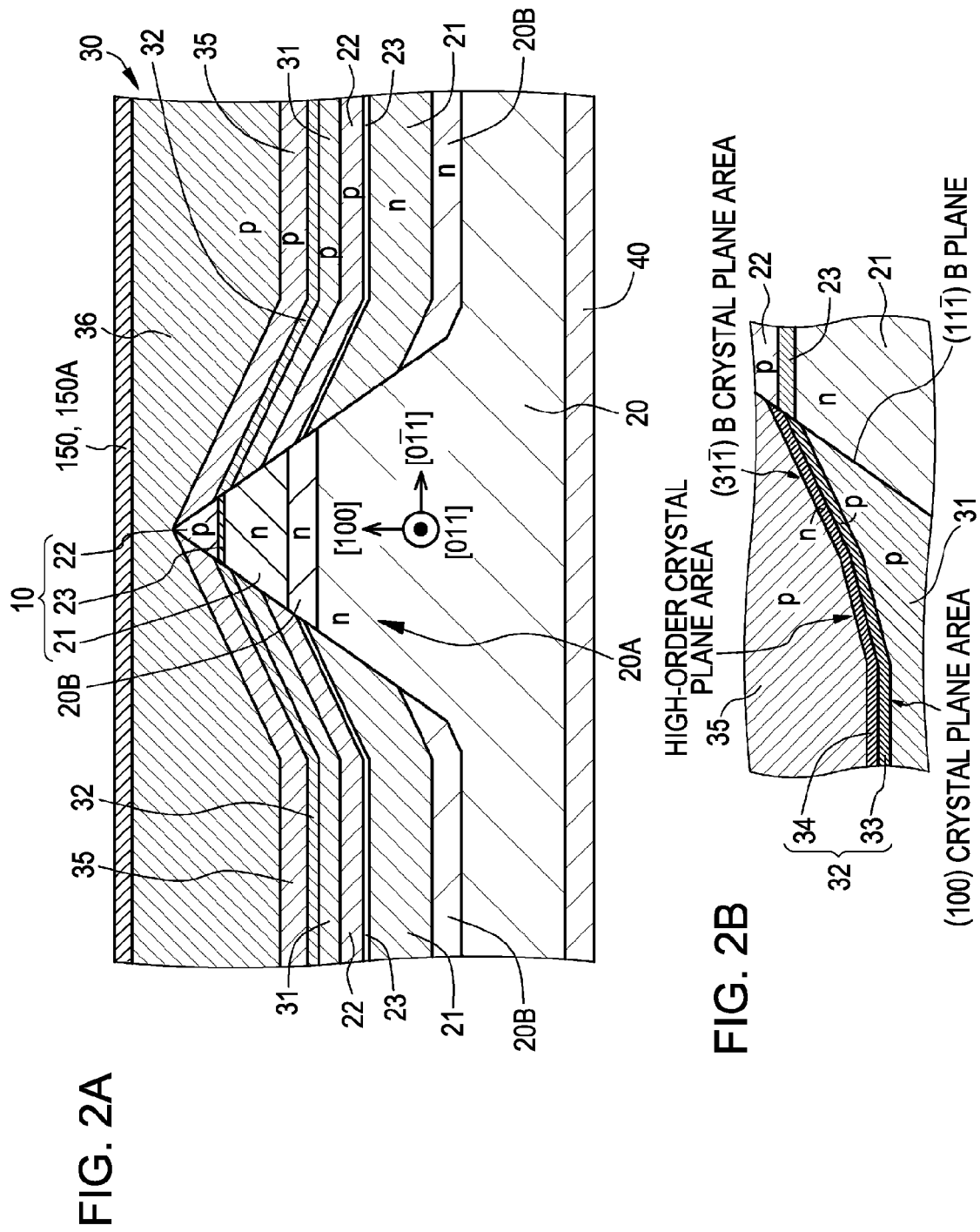

MULTI-BEAM SEMICONDUCTOR LASER

CROSS REFERENCES TO RELATED APPLICATIONS

The present invention contains subject matter related to Japanese Patent Application JP 2008-082709 filed in the Japanese Patent Office on Mar. 27, 2008, the entire contents of which are incorporated herein by reference.

BACKGROUND OF THE INVENTION

1. Field of the Invention

The present invention relates to a multi-beam semiconductor layer having at least two juxtaposed light-emitting portions.

2. Description of the Related Art

Multi-beam semiconductor lasers having a plurality of juxtaposed light-emitting portions are used in various fields. For example, Japanese Unexamined Patent Application Publication No. 2002-324944 discloses a multi-beam semiconductor laser having a separated double heterojunction structure (hereinafter referred to as an "SDH multi-beam semiconductor laser"). The above patent application describes a problem generated when an SDH multi-beam semiconductor laser is mounted on a heat sink or the like by a junction-down method with solder or the like. More specifically, the following problem has been pointed out: When an SDH multi-beam semiconductor laser is mounted by a junction-down method, distortion may be generated in each of light-emitting portions (laminated structures of compound semiconductor layers), and stress may be generated in each of the light-emitting portions. As a result, a change in the refractive index due to a photoelastic effect is generated by the stress, and the state of polarization of a laser beam emitted from each of the light-emitting portions becomes different, that is, polarization of the laser beam is angularly rotated. Such an angular rotation of polarization causes a serious problem in that the transmittance or the reflectance becomes different among the light-emitting portions in a polarization optical system through which a laser beam passes.

This problem of angular rotation of polarization of a laser beam is a problem that does not readily occur in a junction-up-type SDH multi-beam semiconductor laser in the related art because such a semiconductor laser is free of stress. Here, the junction-up-type semiconductor laser is a semiconductor laser having a structure in which, in a light-emitting portion having a laminated structure including a first compound semiconductor layer of a first conductivity type, an active layer provided on the first compound semiconductor layer, and a second compound semiconductor layer of a second conductivity type different from the first conductivity type, the second compound semiconductor layer being provided on the active layer, the thickness of the first compound semiconductor layer is sufficiently larger than the thickness of the second compound semiconductor layer. In addition, in the SDH multi-beam semiconductor laser in the related art, the pitch of juxtaposed light-emitting portions is large; at least about 100 μm. Accordingly, the effect of the juxtaposed light-emitting portions on each other is small, and thus distortion is not readily generated in each of the light-emitting portions (laminated structures of compound semiconductor layers). Therefore, the problem of angular rotation of polarization of a laser beam does not readily occur (see "Reference Example" in the graph of FIG. 3). FIG. 16A shows a schematic plan view of an SDH multi-beam semiconductor laser in the related art having two light-emitting portions. FIG. 16B shows a schematic end view taken along line XVIB-XVIB in FIG. 16A. The two light-emitting portions are separated by a separation groove in order to electrically separate the light-emitting portions.

SUMMARY OF THE INVENTION

In the case where the pitch of juxtaposed light-emitting portions is 100 μm, the rotational difference in polarization between laser beams emitted from two light-emitting portions is about 6 degrees. According to measurements carried out by the inventor of the present invention, it was found that when the pitch of the juxtaposed light-emitting portions is decreased to 30 μm, the difference in angular rotation of polarization between laser beams emitted from the two light-emitting portions (referred to as "rotational difference") reaches no less than 50 degrees (see "Comparative Example 1" in the graph of FIG. 3). Accordingly, when the pitch of juxtaposed light-emitting portions is decreased to about 30 μm, a technique for decreasing the rotational difference in polarization between laser beams emitted from two light-emitting portions is desired.

It is desirable to provide an edge-emitting multi-beam semiconductor laser having a configuration and a structure in which even in the case where the pitch of a plurality of juxtaposed light-emitting portions is small, the rotational difference in polarization between laser beams emitted from the light-emitting portions can be reduced.

An edge-emitting multi-beam semiconductor laser according to an embodiment of the present invention includes juxtaposed stripe-shaped light-emitting portions the number of which is N (wherein N≧2), wherein each of the light-emitting portions includes (A) a first compound semiconductor layer of a first conductivity type, (B) an active layer disposed on the first compound semiconductor layer, (C) a second compound semiconductor layer of a second conductivity type different from the first conductivity type, the second compound semiconductor layer being disposed on the active layer, (D) a first electrode that is electrically connected to the first compound semiconductor layer, (E) a second electrode disposed on the second compound semiconductor layer, and (F) a second-electrode-extending portion extending from the second electrode; the first electrode in the light-emitting portions the number of which is N is commonly provided to the light-emitting portions the number of which is N; at least one separation groove that electrically separates the light-emitting portions from each other is provided between the light-emitting portions; a first recess that is partly discontinuous is provided outside a first light-emitting portion; a second recess that is partly discontinuous is provided outside an Nth light-emitting portion; the second-electrode-extending portion in the first light-emitting portion extends to a first region disposed outside the first light-emitting portion with a continuous portion of the first recess therebetween; the second-electrode-extending portion in the Nth light-emitting portion extends to a second region disposed outside the Nth light-emitting portion with a continuous portion of the second recess therebetween; and the second-electrode-extending portion in an nth light-emitting portion (wherein 2≦n≦(N−1)) extends to the first region disposed outside the first light-emitting portion with a continuous portion of one of the at least one discontinuous separation groove and a continuous portion of the first recess therebetween or extends to the second region disposed outside the Nth light-emitting portion with a continuous portion of one of the at least one discontinuous separation groove and a continuous portion of the second recess therebetween.

The edge-emitting multi-beam semiconductor laser according to an embodiment of the present invention may have an SDH structure.

In the edge-emitting multi-beam semiconductor laser according to an embodiment of the present invention having an SDH structure, a current block layer may be provided outside each of the light-emitting portions, the separation groove, the first recess, and the second recess may penetrate through the current block layer, N=2, and the continuous portion of the first recess and the continuous portion of the second recess may be composed of the current block layer. For the sake of convenience, this structure is referred to as "Structure 1A".

Alternatively, in the edge-emitting multi-beam semiconductor laser according to an embodiment of the present invention having an SDH structure, a current block layer may be provided outside each of the light-emitting portions, the separation groove, the first recess, and the second recess may penetrate through the current block layer, N=2, and the continuous portion of the first recess and the continuous portion of the second recess may be composed of an insulating material layer. For the sake of convenience, this structure is referred to as "Structure 1B".

Alternatively, in the edge-emitting multi-beam semiconductor laser according to an embodiment of the present invention having an SDH structure, a current block layer may be provided outside each of the light-emitting portions, the separation groove, the first recess, and the second recess may penetrate through the current block layer, N≧3, and the continuous portion of the first recess, the continuous portion of the second recess, and the continuous portion of the separation groove may be composed of the current block layer. For the sake of convenience, this structure is referred to as "Structure 1C".

Alternatively, in the edge-emitting multi-beam semiconductor laser according to an embodiment of the present invention having an SDH structure, a current block layer may be provided outside each of the light-emitting portions, the separation groove, the first recess, and the second recess may penetrate through the current block layer, N≧3, and the continuous portion of the first recess, the continuous portion of the second recess, and the continuous portion of the separation groove may be composed of an insulating material layer. For the sake of convenience, this structure is referred to as "Structure 1D".

In Structure 1A to Structure 1D described above, the separation groove, the first recess, and the second recess may penetrate through the current block layer, and may further extend to a layer disposed under the current block layer. In addition, in the case where a compound semiconductor layer is provided on the current block layer, the separation groove, the first recess, and the second recess penetrate through the compound semiconductor layer, and continuous portions of the first recess and second recess are composed of the compound semiconductor layer and the current block layer.

In the edge-emitting multi-beam semiconductor laser having the SDH structure and including the above-described preferred structure according to an embodiment of the present invention, the first region and the second region may be composed of a current block layer.

Alternatively, in the edge-emitting multi-beam semiconductor laser according to an embodiment of the present invention, a non-conducting region composed of at least the second compound semiconductor layer may be provided outside each of the light-emitting portions, the separation groove, the first recess, and the second recess may be provided in the non-conducting region, N=2, and the continuous portion of the first recess and the continuous portion of the second recess may be composed of the non-conducting region. For the sake of convenience, this structure is referred to as "Structure 2A".

Alternatively, in the edge-emitting multi-beam semiconductor laser according to an embodiment of the present invention, a non-conducting region composed of at least the second compound semiconductor layer may be provided outside each of the light-emitting portions, the separation groove, the first recess, and the second recess may be provided in the non-conducting region, N=2, and the continuous portion of the first recess and the continuous portion of the second recess may be composed of an insulating material layer. For the sake of convenience, this structure is referred to as "Structure 2B".

Alternatively, in the edge-emitting multi-beam semiconductor laser according to an embodiment of the present invention, a non-conducting region composed of at least the second compound semiconductor layer may be provided outside each of the light-emitting portions, the separation groove, the first recess, and the second recess may be provided in the non-conducting region, N≧3, and the continuous portion of the first recess, the continuous portion of the second recess, and the continuous portion of the separation groove may be composed of the non-conducting region. For the sake of convenience, this structure is referred to as "Structure 2C".

Alternatively, in the edge-emitting multi-beam semiconductor laser according to an embodiment of the present invention, a non-conducting region composed of at least the second compound semiconductor layer may be provided outside each of the light-emitting portions, the separation groove, the first recess, and the second recess may be provided in the non-conducting region, N≧3, and the continuous portion of the first recess, the continuous portion of the second recess, and the continuous portion of the separation groove may be composed of an insulating material layer. For the sake of convenience, this structure is referred to as "Structure 2D".

In Structure 2A to Structure 2D described above, the non-conducting region is composed of at least the second compound semiconductor layer. The non-conducting region may be provided in the second compound semiconductor layer so as to extend partway therethrough in the thickness direction or may be provided in the second compound semiconductor layer so as to extend the entire way therethrough in the thickness direction. Alternatively, the non-conducting region may be provided so as to extend to the active layer and the first compound semiconductor layer. In addition, the separation groove, the first recess, and the second recess may penetrate through the part of the active layer constituting the non-conducting region and may further extend to a part of the first compound semiconductor layer.

In Structure 2A to Structure 2D described above, the first region and the second region may be composed of the non-conducting region constituted by at least the second compound semiconductor layer.

Furthermore, in the edge-emitting multi-beam semiconductor laser having a preferred form and structure described above, the difference in the amount of rotation of polarization between light components (specifically, laser beams) emitted from edges of the light-emitting portions is preferably 20 degrees or less, though it depends on the specification necessary for the multi-beam semiconductor laser. When light emitted from a light-emitting portion is allowed to pass through a polarizer that rotates the light, the intensity of the light that has passed through the polarizer changes. In this case, when an angle at which the maximum light intensity is obtained with respect to a reference angle of the polarizer is defined as an angle of rotation, the difference in the amount of rotation of polarization is a value calculated by subtracting the minimum angle of rotation from the maximum angle of rotation.

In the edge-emitting multi-beam semiconductor laser having a preferred form and structure described above, the pitch of the juxtaposed light-emitting portions is preferably 90 µm or less, more preferably 50 µm or less, and further preferably 30 µm or less. The minimum value of the pitch of the juxtaposed light-emitting portions can be determined in accordance with the specification necessary for the multi-beam semiconductor laser.

The edge-emitting multi-beam semiconductor laser having Structure 1A or 2A can be produced by a method described below. Specifically, a method of producing an edge-emitting multi-beam semiconductor laser including juxtaposed stripe-shaped light-emitting portions the number of which is N (wherein N≧2), wherein each of the light-emitting portions includes (A) a first compound semiconductor layer of a first conductivity type, (B) an active layer disposed on the first compound semiconductor layer, (C) a second compound semiconductor layer of a second conductivity type different from the first conductivity type, the second compound semiconductor layer being disposed on the active layer, (D) a first electrode that is electrically connected to the first compound semiconductor layer, (E) a second electrode disposed on the second compound semiconductor layer, and (F) a second-electrode-extending portion extending from the second electrode; the first electrode in the light-emitting portions the number of which is N is commonly provided to the light-emitting portions the number of which is N; at least one separation groove that electrically separates the light-emitting portions from each other is provided between the light-emitting portions; a first recess that is partly discontinuous is provided outside a first light-emitting portion; a second recess that is partly discontinuous is provided outside an Nth light-emitting portion; the second-electrode-extending portion in the first light-emitting portion extends to a first region disposed outside the first light-emitting portion with a continuous portion of the first recess therebetween; and the second-electrode-extending portion in the Nth light-emitting portion extends to a second region disposed outside the Nth light-emitting portion with a continuous portion of the second recess therebetween includes step (a) of sequentially forming a first compound semiconductor layer of a first conductivity type, an active layer, and a second compound semiconductor layer of a second conductivity type different from the first conductivity type; step (b) of forming a current block layer or forming a non-conducting region composed of at lease the second compound semiconductor layer; step (c) of forming a second electrode layer on the second compound semiconductor layer, and the current block layer or the non-conducting region; step (d) of patterning the second electrode layer to form a second electrode and a second-electrode-extending portion; step (e) of forming a separation groove, a first recess, and a second recess in the current block layer or the non-conducting region to form a light-emitting portion; and step (f) of forming a first electrode that is electrically connected to the first compound semiconductor layer.

Examples of the order of conducting steps (c), (d), (e), and (f) include, but are not limited to, (1) (c)→(d)→(e)→(f), (2) (e)→(c)→(d)→(f), (3) (c)→(e)→(d)→(f), (4) (f)→(c)→(d)→(e), (5) (f)→(e)→(c)→(d), and (6) (f)→(c)→(e)→(d).

In the edge-emitting multi-beam semiconductor laser having a preferred form and structure described above (hereinafter may be generically simply referred to as a "multi-beam semiconductor laser according to an embodiment of the present invention"), in the case where the first conductivity type is an n-type, the second conductivity type is a p-type, and in the case where the first conductivity type is a p-type, the second conductivity type is an n-type.

Furthermore, in the multi-beam semiconductor laser according to an embodiment of the present invention, in the case where N is an even number of 4 or more, from the second light-emitting portion to the (N/2)th light-emitting portion, the second-electrode-extending portion in each of the light-emitting portions may extend to the first region disposed outside the first light-emitting portion with a continuous portion of the discontinuous separation groove and a continuous portion of the first recess therebetween, and from the {(N/2)+1}th second light-emitting portion to the (N−1)th light-emitting portion, the second-electrode-extending portion in each of the light-emitting portions may extend to the second region disposed outside the Nth light-emitting portion with a continuous portion of the discontinuous separation groove and a continuous portion of the second recess therebetween. In this case, a continuous portion may not be provided in some cases in the separation groove disposed between the (N/2)th light-emitting portion and the {(N/2)+1}th light-emitting portion.

In contrast, in the case where N is an odd number of 5 or more, from the second light-emitting portion to the {(N−1)/2}th light-emitting portion, the second-electrode-extending portion in each of the light-emitting portions may extend to the first region disposed outside the first light-emitting portion with a continuous portion of the discontinuous separation groove and a continuous portion of the first recess therebetween, from the {(N+1)/2+1}th second light-emitting portion to the (N−1)th light-emitting portion, the second-electrode-extending portion in each of the light-emitting portions may extend to the second region disposed outside the Nth light-emitting portion with a continuous portion of the discontinuous separation groove and a continuous portion of the second recess therebetween, and the second-electrode-extending portion in the {(N+1)/2}th light-emitting portion may extend to the first region disposed outside the first light-emitting portion with a continuous portion of the discontinuous separation groove and a continuous portion of the first recess therebetween or extend to the second region disposed outside the Nth light-emitting portion with a continuous portion of the discontinuous separation groove and a continuous portion of the second recess therebetween.

In the multi-beam semiconductor laser according to an embodiment of the present invention, the lengths of the continuous portions of the first recess, the second recess, and the separation groove are preferably as short as possible. It is sufficient that the continuous portions have a length with which a current can sufficiently flow from the second-electrode-extending portion to the second electrode or from the second electrode to the second-electrode-extending portion. From the standpoint of stress relief at an edge, it is preferable that the first recess, the second recess, and the separation groove extend to the edge from which the multi-beam semiconductor laser emits light.

In the multi-beam semiconductor laser according to an embodiment of the present invention, examples of the materials constituting the insulating material layer include a combination of $SiO_2$ and a polyimide resin, a combination of SiN and a polyimide resin, a combination of SiON and a polyimide resin, and a combination of AlN and a polyimide resin.

In the multi-beam semiconductor laser according to an embodiment of the present invention, when the first conductivity type is an n-type and the second conductivity type is a p-type, the first electrode is an n-side electrode and the second electrode including the second-electrode-extending portion is a p-side electrode. On the other hand, when the first conductivity type is a p-type and the second conductivity type is an n-type, the first electrode is a p-side electrode and the second electrode including the second-electrode-extending portion is an n-side electrode. Here, examples of the structure of the p-side electrode include Au/AuZn, Au/Pt/Ti(/Au)/ AuZn, Au/Pt/TiW(/Ti)(/Au)/AuZn, Au/AuPd, Au/Pt/Ti(/ Au)/AuPd, Au/Pt/TiW(/Ti)(/Au)/AuPd, Au/Pt/Ti, Au/Pt/TiW (/Ti), and Au/Pt/TiW/Pd/TiW(/Ti). Examples of the structure of the n-side electrode include Au/Ni/AuGe, Au/Pt/Ti(/Au)/ Ni/AuGe, and Au/Pt/TiW(/Ti)/Ni/AuGe. Note that, in the above structures of the electrodes, layers further to the left are more electrically separated from the active layer. Alternatively, the first electrode may be made of a transparent conductive material such as ITO, IZO, ZnO:Al, or ZnO:B. In the case where a layer made of a transparent conductive material is used as a current-diffusion layer and the first electrode is used as an n-side electrode, a metal laminated structure described in the case where the first electrode is used as a p-side electrode may be used in combination.

In addition, if necessary, a contact portion (pad portion) composed of a plurality of metal layers with a laminated structure such as [adhesion layer (e.g., Ti layer or Cr layer)]/ [barrier metal layer (e.g., Pt layer, Ni layer, TiW layer, or Mo layer]/[metal layer having compatibility for mounting (e.g., Au layer)], for example, Ti layer/Pt layer/Au layer may be provided on the first electrode or the second-electrode-extending portion. The first electrode, the second electrode including the second-electrode-extending portion, and the contact portion (pad portion) can be formed by a physical vapor deposition (PVD) method such as a vacuum evaporation method or a sputtering method, a chemical vapor deposition (CVD) method, or a plating method.

Examples of the substrate used in the multi-beam semiconductor laser according to an embodiment of the present invention include a GaAs substrate, a GaP substrate, an AlN substrate, an AlP substrate, an InN substrate, an InP substrate, an AlGaInN substrate, an AlGaN substrate, an AlInN substrate, a GaInN substrate, an AlGaInP substrate, an AlGaP substrate, an AlInP substrate, a GaInP substrate, a ZnS substrate, a sapphire substrate, a SiC substrate, an alumina substrate, a ZnO substrate, a LiMgO substrate, a LiGaO$_2$ substrate, a MgAl$_2$O$_4$ substrate, a Si substrate, a Ge substrate, and a substrate in which an underlayer or a buffer layer is provided on a surface (principal surface) of any of these substrates. In addition, in an embodiment of the present invention, first, the multi-beam semiconductor laser is provided on a substrate. However, the final form of the multi-beam semiconductor laser may be a form in which the multi-beam semiconductor laser is disposed on a substrate, or a form in which the substrate has been removed therefrom. The multi-beam semiconductor laser can be mounted by a junction-up method.

Examples of the compound semiconductor layers including an active layer include GaN compound semiconductors (including an AlGaN mixed crystal, an AlGaInN mixed crystal, and a GaInN mixed crystal), GaInNAs compound semiconductors (including a GaInAs mixed crystal and a GaNAs mixed crystal), AlGaInP compound semiconductors, AlAs compound semiconductors, AlGaInAs compound semiconductors, AlGaAs compound semiconductors, GaInAs compound semiconductors, GaInAsP compound semiconductors, GaInP compound semiconductors, GaP compound semiconductors, InP compound semiconductors, InN compound semiconductors, and AlN compound semiconductors. Examples of an n-type impurity added to the compound semiconductor layers include silicon (Si), selenium (Se), germanium (Ge), tin (Sn), carbon (C), and titanium (Ti). Examples of a p-type impurity added to the compound semiconductor layers include zinc (Zn), magnesium (Mg), beryllium (Be), cadmium (Cd), calcium (Ca), barium (Ba), and oxygen (O). The active layer may be composed of a single compound semiconductor layer. Alternatively, the active layer may have a single quantum well structure (QW structure) or a multi-quantum well structure (MQW structure). Examples of the method of forming the compound semiconductor layers including the active layer (deposition method) include metal-organic chemical vapor deposition methods (MOCVD method), a metal-organic vapor phase epitaxy (MOVPE method), a metal-organic molecular beam epitaxy method (MOMBE method), and a hydride vapor phase epitaxy method (HVPE method) in which a halogen contributes to a transport or a reaction.

Examples of the method of forming the non-conducting region in Structure 2A to Structure 2D include a method of introducing a boron ion or a hydrogen ion by ion implantation and a method of embedding such an ion by an epitaxial growth method.

In the edge-emitting multi-beam semiconductor laser according to an embodiment of the present invention, each of the light-emitting portions is sandwiched by separation grooves, a separation groove and a first recess, or a separation groove and second recess. Accordingly, when the multi-beam semiconductor laser is viewed from a light-emitting portion, the separation groove, and the first recess or the second recess are symmetrically present at both sides of the light-emitting portion, and thus distortion does not readily occur in each of the light-emitting portions (laminated structures of compound semiconductor layers). As a result, the difference in the state of polarization between laser beams emitted from the light-emitting portions can be reduced. Specifically, as a result of a reduction in the rotational difference in angular rotation of polarization between the laser beams, an edge-emitting multi-beam semiconductor laser having a high performance can be provided.

BRIEF DESCRIPTION OF THE DRAWINGS

FIG. 2A is a schematic partial cross-sectional view of a light-emitting portion etc. in an edge-emitting multi-beam semiconductor laser having an SDH structure;

FIG. 2B is an enlarged schematic partial cross-sectional view of the light-emitting portion etc. in the edge-emitting multi-beam semiconductor laser having an SDH structure;

DESCRIPTION OF THE PREFERRED EMBODIMENTS

Embodiments of the present invention will now be described with reference to the drawings.

First Embodiment

A first embodiment relates to an edge-emitting multi-beam semiconductor laser (hereinafter simply referred to as a "multi-beam semiconductor laser") according to an embodiment of the present invention. More specifically, the multi-beam semiconductor laser of the first embodiment has an SDH structure, and further has Structure 1A.

Figure 1A:
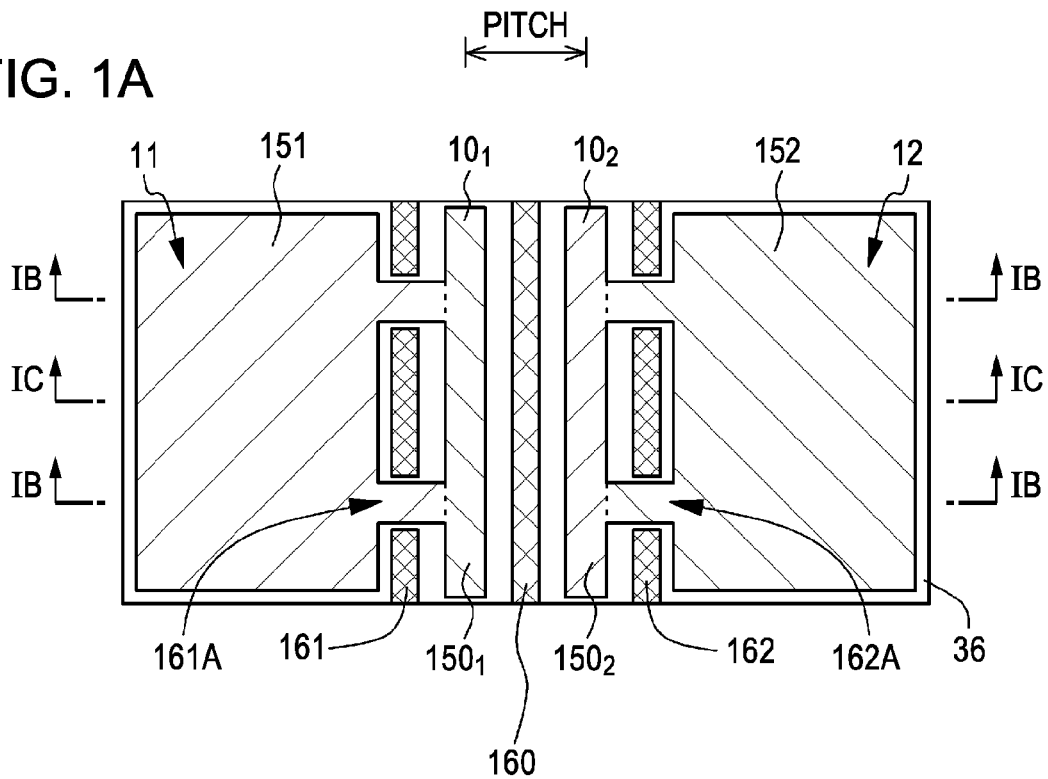
FIG. 1A is a schematic plan view of an edge-emitting multi-beam semiconductor laser of a first embodiment.
Figure 1B:
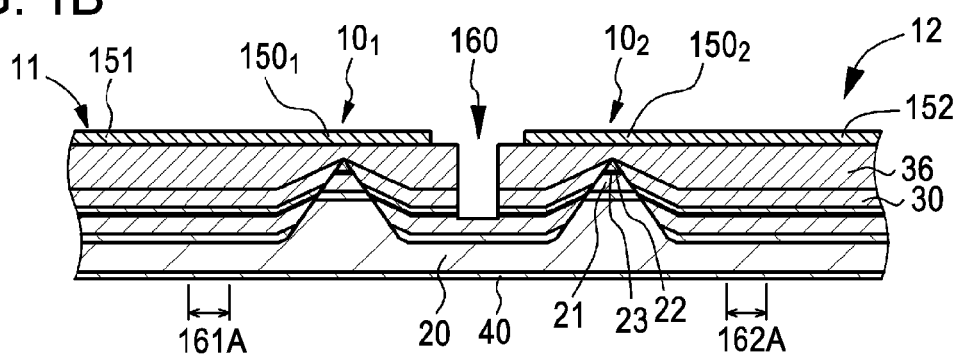
FIG. 1B is a schematic partial end view taken along line IB-IB in FIG. 1A.
Figure 1C:
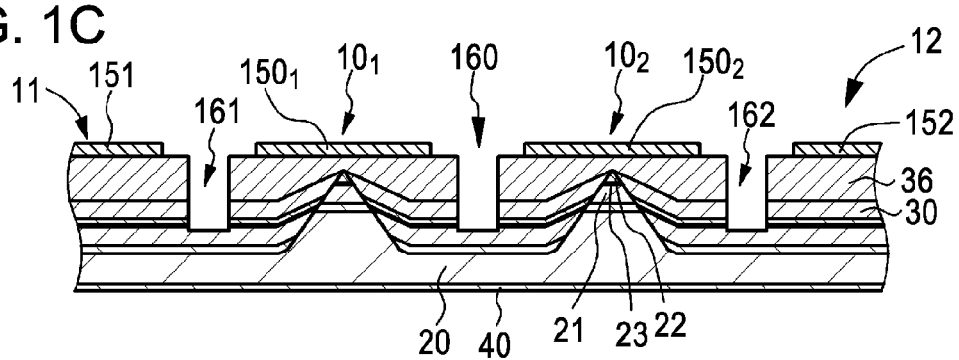
FIG. 1C is a schematic partial end view taken along line IC-IC in FIG. 1A.

FIG. 1A is a schematic plan view of the multi-beam semiconductor laser of the first embodiment, FIG. 1B is a schematic partial end view taken along line IB-IB in FIG. 1A, and FIG. 1C is a schematic partial end view taken along line IC-IC in FIG. 1A. FIG. 2A is a schematic partial cross-sectional view of a light-emitting portion etc. in a multi-beam semiconductor laser having the SDH structure, and FIG. 2B is an enlarged schematic partial cross-sectional view thereof. In FIG. 1A, in order to clearly show second-electrode-extending portions, the second-electrode-extending portions are shown by rough hatching. In order to clearly show second electrodes, the second electrodes are shown by fine hatching. In order to clearly show a separation groove, the separation groove is shown by rough cross-hatching. In order to clearly show a first recess and a second recess, these recesses are shown by fine cross-hatching.

In the first embodiment, or a second embodiment to a fifth embodiment described below, juxtaposed stripe-shaped light-emitting portions the number of which is N (wherein N is an integer of 2 or more) are provided. Here, each of light-emitting portions 10 has a laser cavity structure. In the first embodiment, N is 2. In the first embodiment, each of the light-emitting portions 10 ($10_1$ and $10_2$) includes (A) a first compound semiconductor layer 21 of a first conductivity type (an n-type in the first embodiment and the second to fifth embodiments described below), (B) an active layer 23 disposed on the first compound semiconductor layer 21, (C) a second compound semiconductor layer 22 of a second conductivity type (a p-type in the first embodiment and the second to fifth embodiments described below) different from the first conductivity type, the second compound semiconductor layer 22 being disposed on the active layer 23, (D) a first electrode 40 that is electrically connected to the first compound semiconductor layer 21, (E) a second electrode 150 ($150_1$ or $150_2$) disposed on the second compound semiconductor layer 22, and (F) a second-electrode-extending portion 151 or 152 extending from the second electrode $150_1$ or $150_2$.

Furthermore, in the first embodiment, the first electrode 40 in the light-emitting portions 10 the number of which is N is commonly provided to the light-emitting portions 10 the number of which is N. Here, the light-emitting portions 10 ($10_1$ and $10_2$) are provided on a surface (principal surface) of a substrate 20, and the first electrode 40 is provided on a reverse face of the substrate 20. A separation groove 160 that electrically separates the light-emitting portions 10 from each other is provided between the light-emitting portions 10. Furthermore, a first recess 161 that is partly discontinuous is provided outside a first light-emitting portion $10_1$. A second recess 162 that is partly discontinuous is provided outside an Nth light-emitting portion $10_N$ (specifically, a light-emitting portion $10_2$ in the first embodiment). The second-electrode-extending portion 151 in the first light-emitting portion $10_1$ extends to a first region 11 disposed outside the first light-emitting portion $10_1$ with a continuous portion 161A of the first recess 161 therebetween. The second-electrode-extending portion 152 in the Nth light-emitting portion $10_N$ (specifically, light-emitting portion $10_2$ in the first embodiment) extends to a second region 12 disposed outside the Nth light-emitting portion $10_N$ with a continuous portion 162A of the second recess 162 therebetween. Note that the first recess 161, the second recess 162, and the separation groove 160 extend to an edge from which the multi-beam semiconductor laser emits light.

In the multi-beam semiconductor laser according to an embodiment of the present invention, a second-electrode-extending portion in the nth light-emitting portion (wherein $2 \le n \le (N-1)$) extends to the first region 11 disposed outside the first light-emitting portion $10_1$ with a continuous portion of a discontinuous separation groove and a continuous portion 161A of the first recess 161 therebetween, or extends to the second region 12 disposed outside the Nth light-emitting portion $10_N$ with a continuous portion of a discontinuous separation groove and a continuous portion 162A of the second recess 162 therebetween. In the first embodiment, however, such an nth light-emitting portion $10_n$ is not present because N is 2.

In the multi-beam semiconductor laser of the first embodiment, as described above, N is 2, and a current block structure 30 including a current block layer 32 is provided outside the light-emitting portions 10. The separation groove 160, the first recess 161, and the second recess 162 are provided in the current block structure 30 including the current block layer 32. Here, the continuous portion 161A of the first recess 161 and the continuous portion 162A of the second recess 162 are composed of the current block structure 30 including the current block layer 32. More specifically, the current block structure 30 has a laminated structure including a current-block-layer-position-adjusting layer 31, the current block layer 32 (composed of a p-type compound semiconductor layer 33 and an n-type compound semiconductor layer 34), and an embedded layer 35. A contact layer (cap layer) 36 is provided on the current block structure 30. Each of the first region 11 and the second region 12 is composed of the current block structure 30 including the current block layer 32.

Figure 4A:
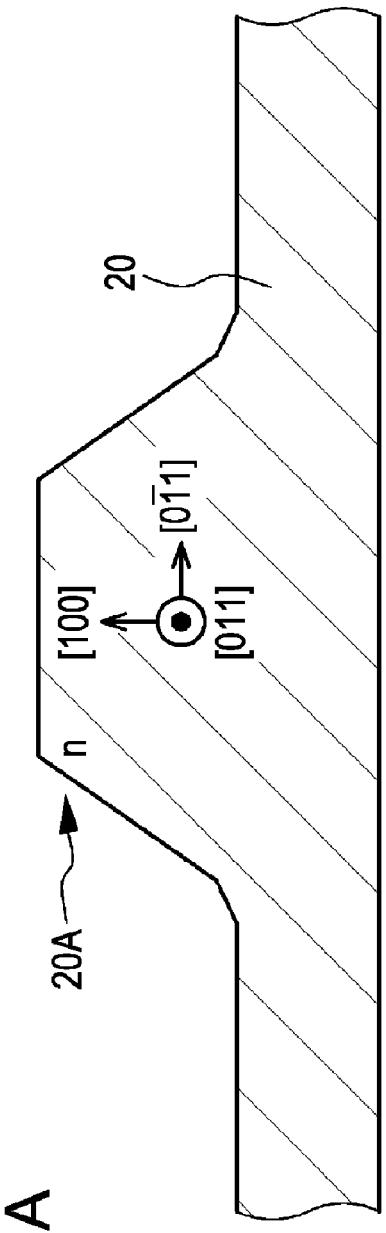
FIGS. 4A and 4B are schematic partial end views of a substrate etc. illustrating a method of producing the edge-emitting multi-beam semiconductor laser of the first embodiment.
Figure 4B:
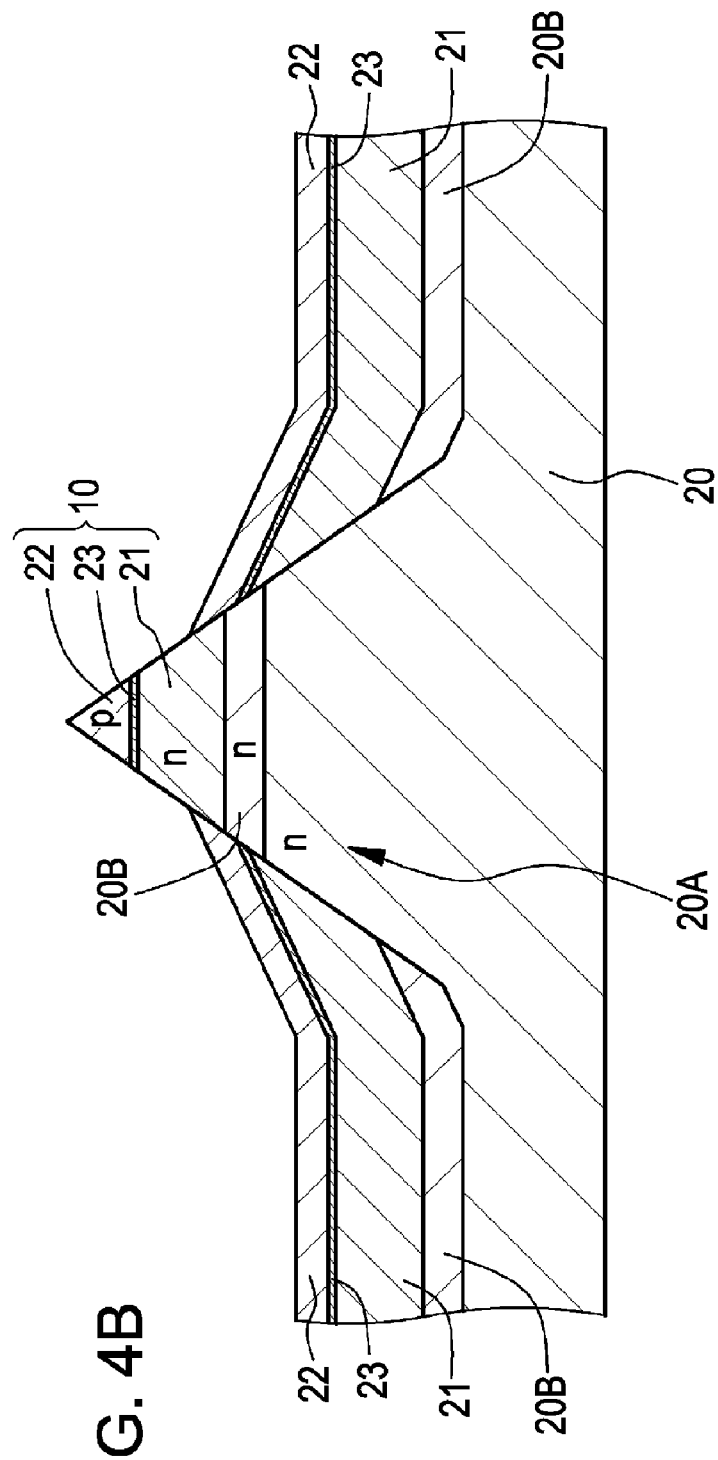
Figure 5:
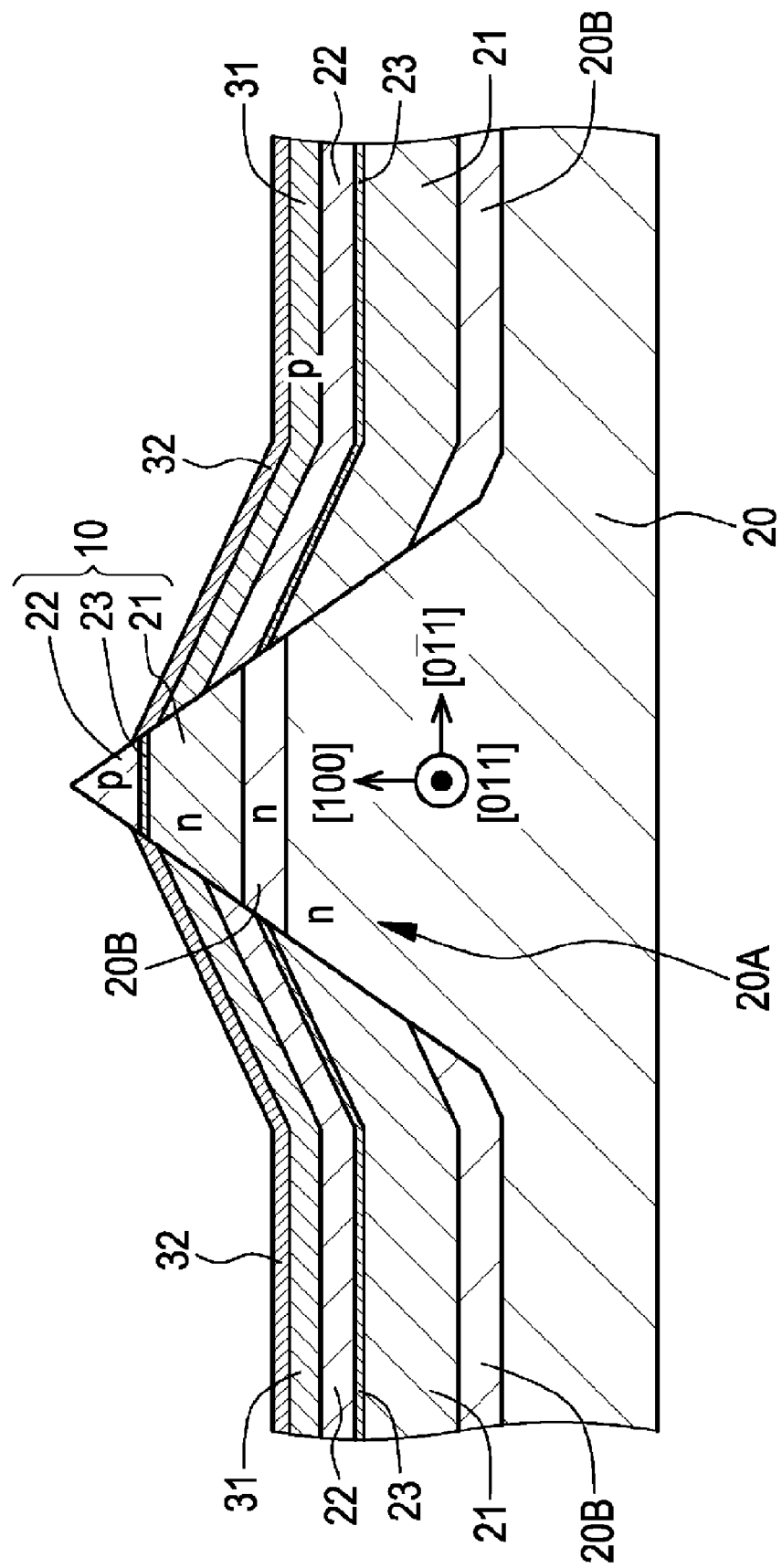
FIG. 5 is a schematic partial end view of the substrate etc. illustrating the method of producing the edge-emitting multi-beam semiconductor laser of the first embodiment.

A method of producing the multi-beam semiconductor laser of the first embodiment will now be described with reference to FIGS. 4A and 4B and FIGS. 5 and 6. In FIGS. 4A and 4B, and FIG. 5, only a single light-emitting portion is schematically shown.

Step-100

First, a first compound semiconductor layer 21 of a first conductivity type, an active layer 23, and a second compound semiconductor layer 22 of a second conductivity type that is different from the first conductivity type are sequentially formed on a substrate 20.

Step-100A

Specifically, first, a stripe-shaped etching mask having a desired width and extending in the [011]A direction is formed by a photolithography technique on a principal surface composed of a {100} crystal plane, for example, the (100) crystal plane of the substrate 20 made of n-GaAs. The principal surface is then wet-etched with an etchant prepared by mixing $H_2SO_4$, $H_2O_2$, and $H_2O$ at a ratio of $H_2SO_4$:$H_2O_2$:$H_2O$=3:1:1 using the etching mask to form a light-emitting-portion-forming region 20A extending in the [011]A direction. The width direction of the light-emitting-portion-forming region 20A is parallel to the [0-11]B direction. Subsequently, the etching mask is removed. Accordingly, the structure shown in FIG. 4A can be obtained. Inclined surfaces (side faces) composed of a {111}B plane are formed on the light-emitting-portion-forming region 20A. This {111}B plane is a non-growth plane.

Step-100B

Subsequently, a buffer layer 20B, the first compound semiconductor layer 21, the active layer 23, and the second compound semiconductor layer 22 are epitaxially grown on a projection surface and recess surfaces by a normal MOCVD method, that is, an MOCVD method using an organic metal or a hydride as a raw material gas. These layers are made of, for example, an AlGaAs compound semiconductor. In this case, each of the inclined surface (side faces) of the compound semiconductor layer on the projection surface is composed of a {111}B plane, and, as described above, the {111}B plane is a non-growth plane. Accordingly, the buffer layer 20B, the first compound semiconductor layer 21, the active layer 23, and the second compound semiconductor layer 22 are formed (laminated) so that these layers formed in the region on the projection surface are separated from the layers formed in the regions on the recess surfaces. Accordingly, the structure shown in FIG. 4B can be obtained.

Step-100C

Subsequent to the formation of the second compound semiconductor layer 22, a current-block-layer-position-adjusting-layer 31 is formed over the entire surface by an MOCVD method, and furthermore, a current block layer 32 composed of, for example, a p-type compound semiconductor layer 33 and an n-type compound semiconductor layer 34 is sequentially formed by an MOCVD method (see FIG. 5). The current block layer 32 does not grow on the {111}B plane. The current block layer 32 is formed such that an edge of the current block layer 32 covers at least the side face of the active layer 23. This configuration and structure can be realized by appropriately selecting the thickness of the current-block-layer-position-adjusting-layer 31. These layers are made of, for example, an AlGaAs compound semiconductor.

Step-100D

Subsequently, an embedded layer 35 made of an AlGaAs compound semiconductor and a contact layer 36 made of a GaAs compound semiconductor are sequentially formed over the entire surface by a MOCVD method. More specifically, when MOCVD is continued, the embedded layer 35 made of a compound semiconductor, whose crystal is to be grown from the recess surfaces, completely covers the light-emitting portion 10, whose self growth has stopped.

By appropriately selecting the width and the depth of the light-emitting-portion-forming region 20A (projection surface), and furthermore, by appropriately selecting the thicknesses of the buffer layer 20B, the first compound semiconductor layer 21, the active layer 23, and the second compound semiconductor layer 22, the laminated structure of the light-emitting portion 10 having a triangular cross section can be formed on the light-emitting-portion-forming region 20A (projection surface).

Next, a planarizing process of the contact layer 36 is performed. A second electrode layer 150A composed of Au/Pt/Ti (wherein the Au layer is a top layer and the Ti layer is the bottom layer) is then formed on the second compound semiconductor layer (more specifically, on the contact layer 36 in the first embodiment) by vacuum evaporation. Accordingly, the light-emitting portion 10 having the SDH structure and shown in FIGS. 2A and 2B can be obtained.

Step-120

Figure 6:
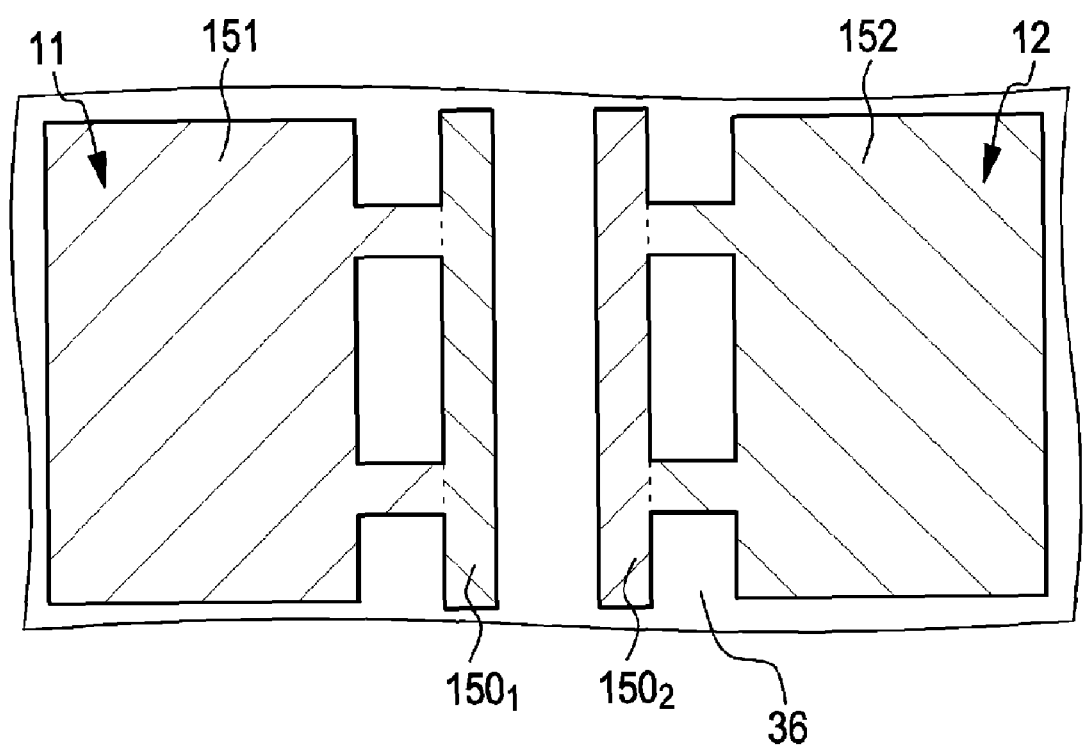
FIG. 6 is a schematic partial plan view illustrating the method of producing the edge-emitting multi-beam semiconductor laser of the first embodiment.

Subsequently, the second electrode layer 150A is patterned by existing photolithography and etching techniques, thereby forming second electrodes $150_1$ and $150_2$ and second-electrode-extending portions 151 and 152 (see the schematic partial plan view of FIG. 6). In FIG. 6, in order to clearly show the second electrodes $150_1$ and $150_2$ and the second-electrode-extending portions 151 and 152, these are shown by oblique lines.

Next, the contact layer 36 and the current block structure 30 are etched by existing photolithography and etching techniques, thereby forming a separation groove 160, a first recess 161, and a second recess 162. Accordingly, light-emitting portions $10_1$ and $10_2$ are formed. More specifically, the current block structure 30 is etched so that the contact layer 36, the embedded layer 35, and the current block layer 32 are penetrated, the current-block-layer-position-adjusting-layer 31 is further penetrated, and the first compound semiconductor layer is removed to a halfway position in the thickness direction.

Step-140

Subsequently, the substrate 20 is lapped from the reverse face side so as to have an appropriate thickness. A first electrode 40 composed of Au/Ni/AuGe (wherein the Au layer is a top layer and the AuGe layer is the bottom layer) is then formed by vacuum evaporation. Accordingly, the common first electrode 40 that is electrically connected to the first compound semiconductor layer 21 can be formed.

Step-150

Subsequently, the multi-beam semiconductor lasers are separated from each other to obtain a multi-beam semiconductor laser of the first embodiment. Finally, the multi-beam semiconductor laser is mounted by a junction-up method.

Figure 3:
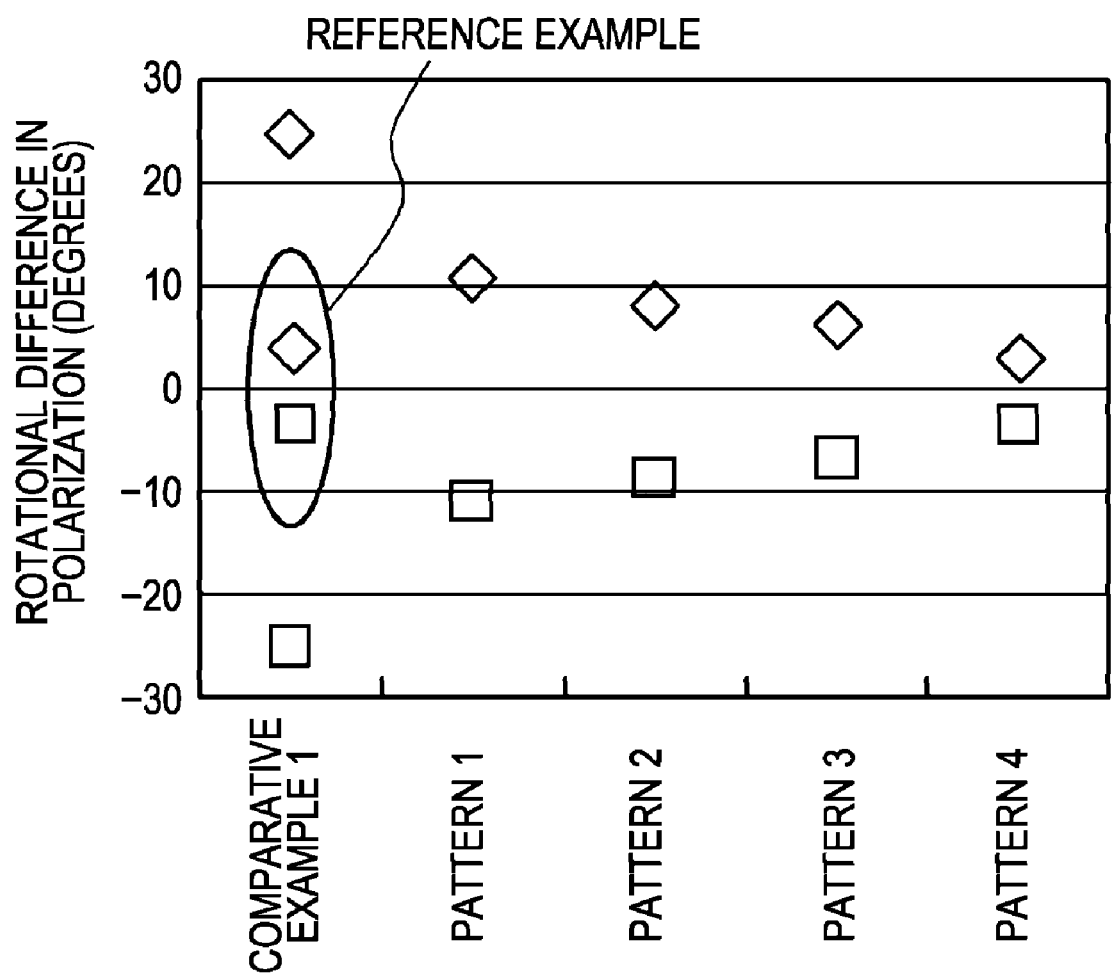
FIG. 3 is a graph showing measurement results etc. of the relationship between the length of continuous portions in a first recess and a second recess a part of which is discontinuous and the rotational difference in polarization between laser beams emitted from two light-emitting portions.
Figure 16A:
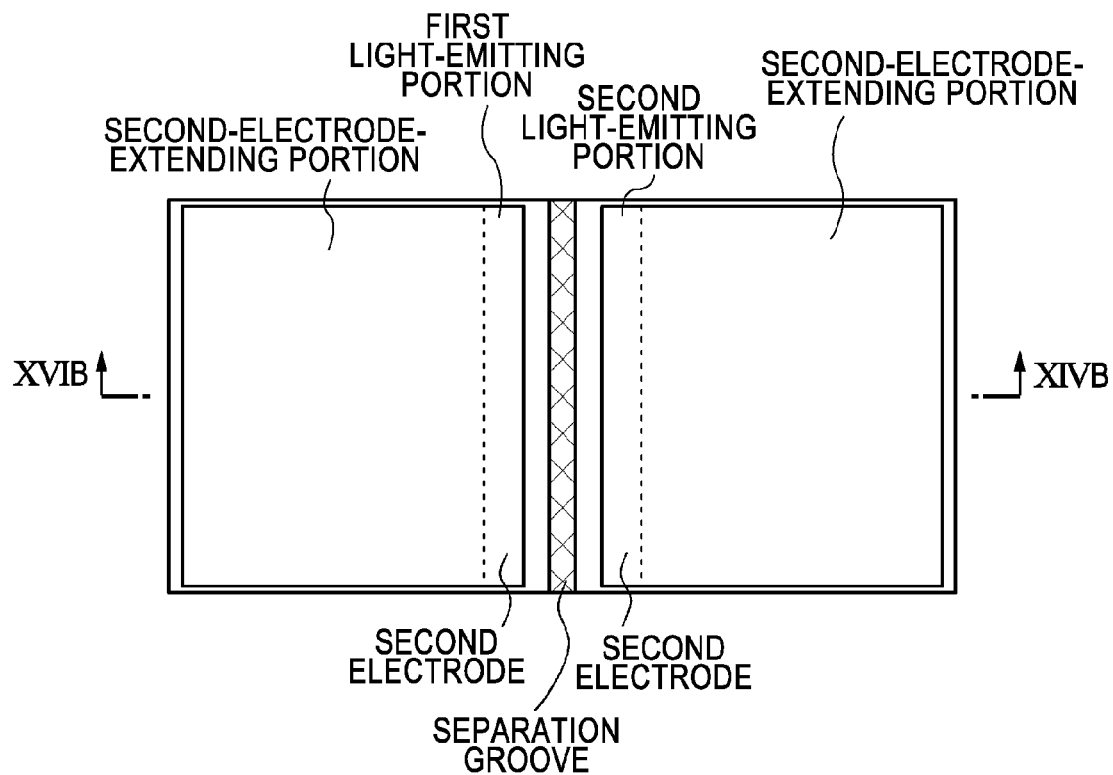
FIG. 16A is a schematic plan view of an SDH multi-beam semiconductor laser having two light-emitting portions in the related art.
Figure 16B:
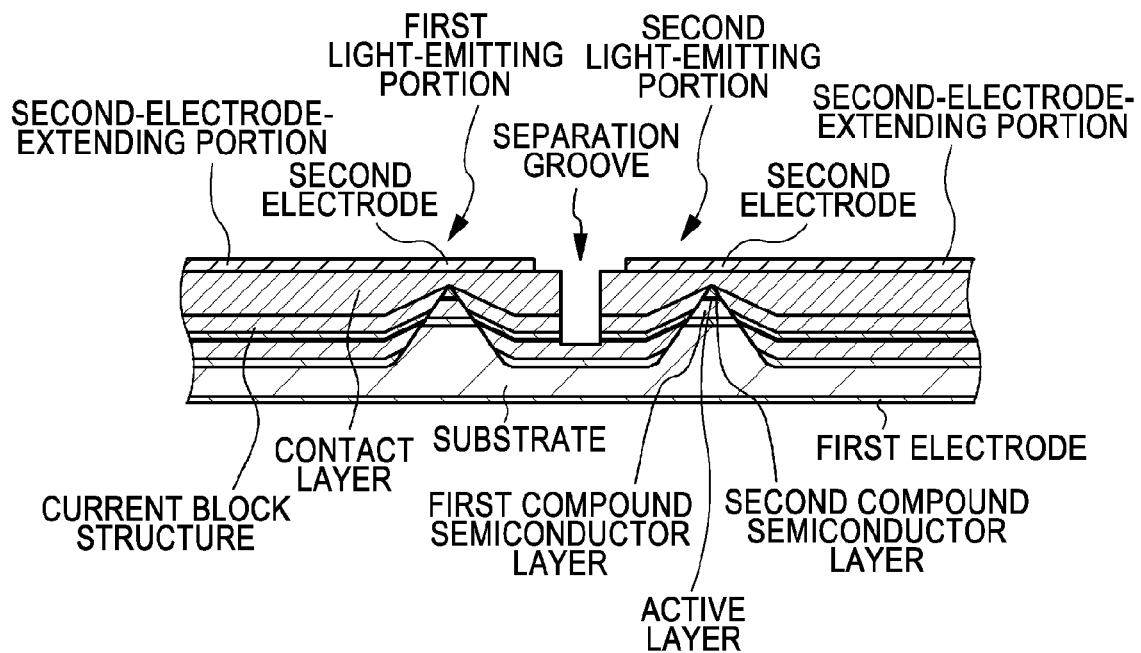
FIG. 16B is a schematic end view of the SDH multi-beam semiconductor laser in the related art.

FIG. 3 shows measurement results of the relationship between the length of the continuous portions 161A and 162A in the first recess 161 and the second recess 162, respectively, a part of the recesses 161 and 162 being discontinuous, and the rotational difference in polarization between laser beams emitted from the two light-emitting portions $10_1$ and $10_2$. Here, the pitch of the two juxtaposed light-emitting portions $10_1$ and $10_2$ is 30 μm. The meaning of "Pattern 1", "Pattern 2", "Pattern 3", and "Pattern 4" shown in FIG. 3 is described below. The length (total length) of the continuous portions 161A and 162A in the first recess 161 and the second recess 162, respectively, a part of the recesses 161 and 162 being discontinuous, is represented by "L". The number of continuous portions 161A and 162A in the first recess 161 and the second recess 162, respectively, a part of the recesses 161 and 162 being discontinuous, is represented by "M". In FIG. 3, "Comparative Example 1" shows the measurement results of a multi-beam semiconductor laser in which the first recess and the second recess are not provided in the multi-beam semiconductor laser of the first embodiment (wherein the pitch of two juxtaposed light-emitting portions is 30 μm, see FIGS. 16A and 16B). Furthermore, "Reference Example" shows the measurement results of a multi-beam semiconductor laser in which the first recess and the second recess are not provided in the multi-beam semiconductor laser of the first embodiment (wherein the pitch of two juxtaposed light-emitting portions is 100 μm, see FIGS. 16A and 16B).

|  | M | L |
|---|---|---|
| Pattern 1 | 2 | 200 μm (= 100 μm × 2) |
| Pattern 2 | 1 | 100 μm (= 100 μm × 1) |
| Pattern 3 | 2 | 100 μm (= 50 μm × 2) |
| Pattern 4 | 2 | 50 μm (= 25 μm × 2) |

The results shown in FIG. 3 show that, as the value of L decreases, the value of the rotational difference decreases. In Pattern 4, the rotational difference in polarization between laser beams emitted from the two light-emitting portions 101 and 102 is about 4 degrees. In contrast, in Comparative Example 1, the rotational difference in polarization between laser beams emitted from the two light-emitting portions reached no less than 50 degrees. As described above, in the multi-beam semiconductor laser of the first embodiment, the light-emitting portion $10_1$ is sandwiched between the separation groove 160 and the first recess 161, and the light-emitting portion $10_2$ is sandwiched between the separation groove 160 and the second recess 162. Accordingly, when the multi-beam semiconductor laser is viewed from a light-emitting portion, the separation groove 160, and the first recess 161 or the second recesses 162 are symmetrically present at both sides thereof, and thus distortion does not readily occur in each of the light-emitting portions $10_1$ and $10_2$. As a result, the difference in the state of polarization between laser beams emitted from the light-emitting portions $10_1$ and $10_2$ can be reduced. That is, the rotational difference in angular rotation of polarization between the laser beams can be reduced.

Second Embodiment

A second embodiment is a modification of the first embodiment and relates to Structure 1B.

Figure 7A:
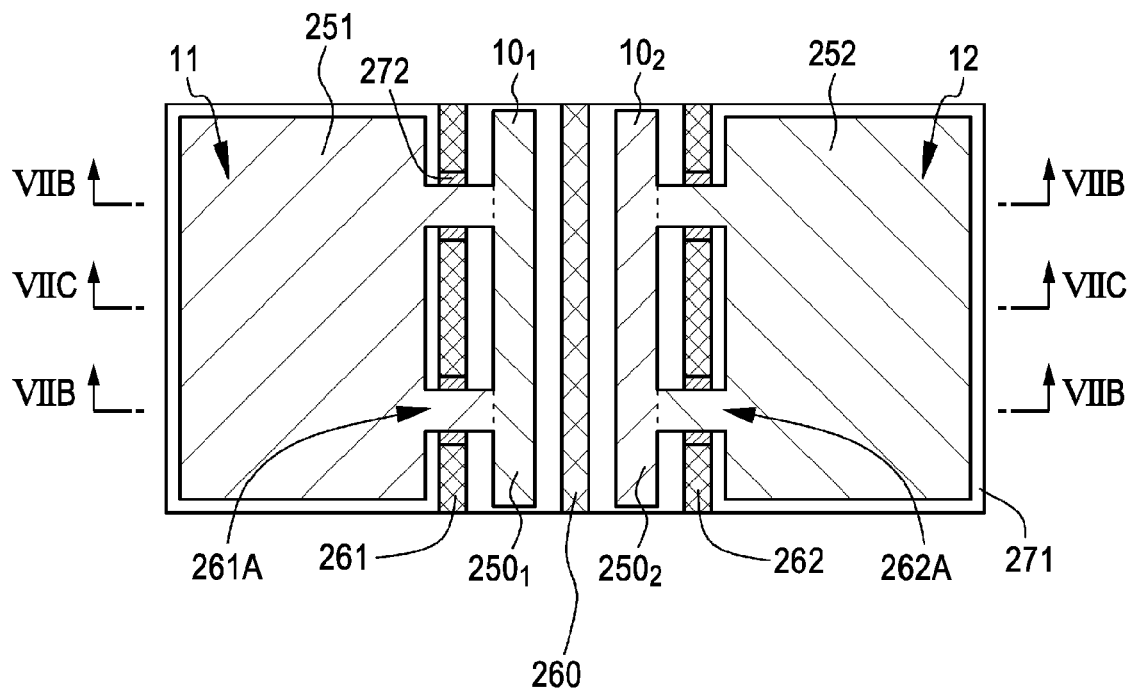
FIG. 7A is a schematic plan view of an edge-emitting multi-beam semiconductor laser of a second embodiment.
Figure 7B:
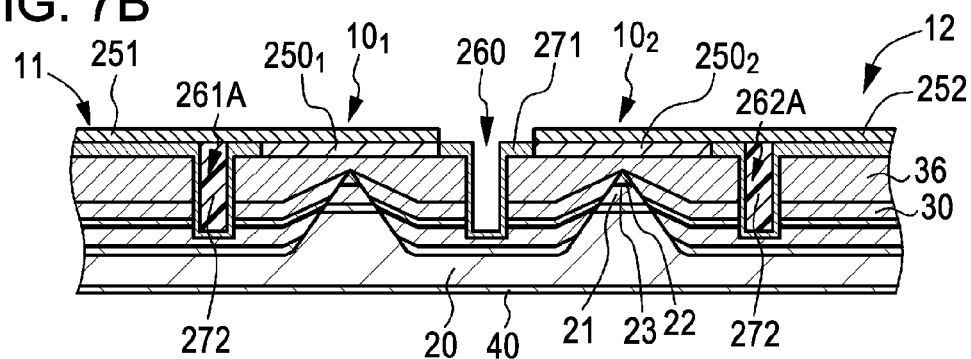
FIG. 7B is a schematic partial end view taken along line VIIB-VIIB in FIG. 7A.
Figure 7C:
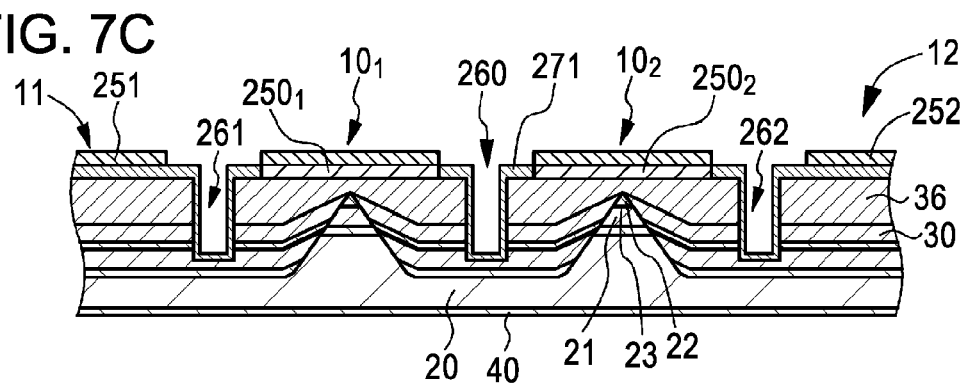
FIG. 7C is a schematic partial end view taken along line VIIC-VIIC in FIG. 7A.

FIG. 7A is a schematic plan view of a multi-beam semiconductor laser of the second embodiment. FIG. 7B is a schematic partial end view taken along line VIIB-VIIB in FIG. 7A. FIG. 7C is a schematic partial end view taken along line VIIC-VIIC in FIG. 7A. A schematic partial cross-sectional view of a light-emitting portion etc. of a multi-beam semiconductor laser having an SDH structure is shown in FIG. 2A, and an enlarged schematic partial cross-sectional view thereof is shown in FIG. 2B. In FIG. 7A, in order to clearly show second-electrode-extending portions, the second-electrode-extending portions are shown by rough hatching. In order to clearly show second electrodes disposed under the second-electrode-extending portions, the second electrodes are shown by fine hatching. In order to clearly show a separation groove, the separation groove is shown by rough cross-hatching. In order to clearly show a first recess and a second recess, these recesses are shown by fine cross-hatching. In order to clearly show continuous portions of the first recess and second recess, these continuous portions of the first recess and second recess are shown by the finest hatching.

In the multi-beam semiconductor laser of the second embodiment, as in the first embodiment, a current block layer 32 is provided outside light-emitting portions $10_1$ and $10_2$; a separation groove 260, a first recess 261, and a second recess 262 are provided in the current block layer 32; and N is 2. The second embodiment differs from the first embodiment in that continuous portions 261A and 262A of the first recess 261 and the second recess 262, respectively, are composed of an insulating material layer. Here, the insulating material layer is specifically composed of a $SiO_2$ layer 271 and a polyimide resin layer 272.

Specifically, the multi-beam semiconductor laser of the second embodiment can be produced by a method described below.

Step-200

First, the same steps as Step-100 to Step-110 of the first embodiment are performed.

Step-210

Figure 8A:
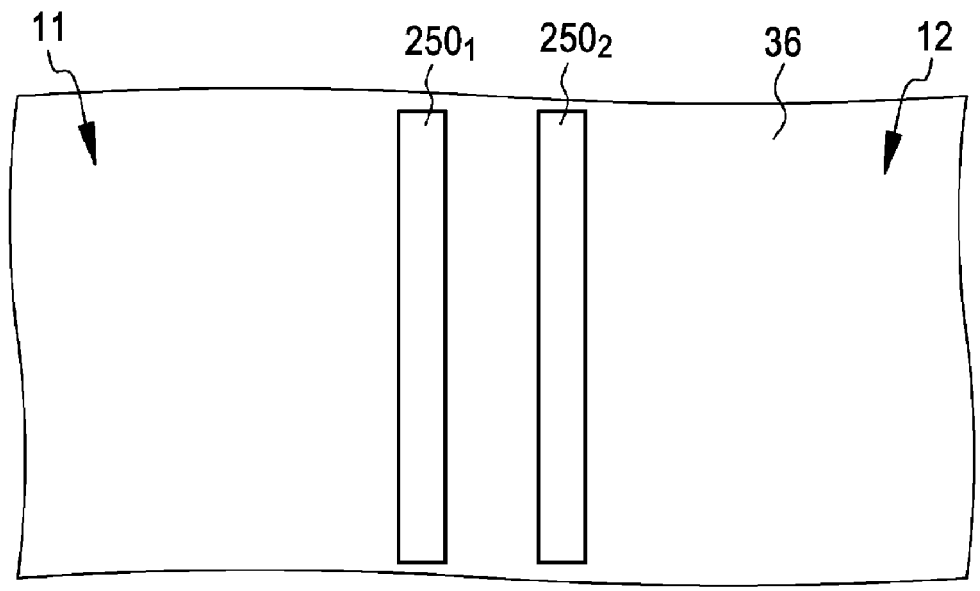
FIGS. 8A and 8B are schematic partial plan views illustrating a method of producing the edge-emitting multi-beam semiconductor laser of the second embodiment.

Subsequently, a second electrode layer is patterned by existing photolithography and etching techniques as in Step-120 of the first embodiment, thereby forming second electrodes $250_1$ and $250_2$ (see the schematic partial plan view of FIG. 8A). Unlike the first embodiment, second-electrode-extending portions 251 and 252 are not formed in this step.

Step-220

Subsequently, a contact layer 36 and a current block structure 30 are etched by existing photolithography and etching techniques as in Step-130 of the first embodiment, thereby forming a separation groove 260, a first recess 261, and a second recess 262. Accordingly, light-emitting portions $10_1$ and $10_2$ are formed. In the second embodiment and a fourth embodiment described below, the current block structure 30 may be etched so that the contact layer 36, an embedded layer 35, and a current block layer 32 are penetrated, and a current-block-layer-position-adjusting-layer 31 is removed to a halfway position in the thickness direction.

Step-230

Figure 8B:
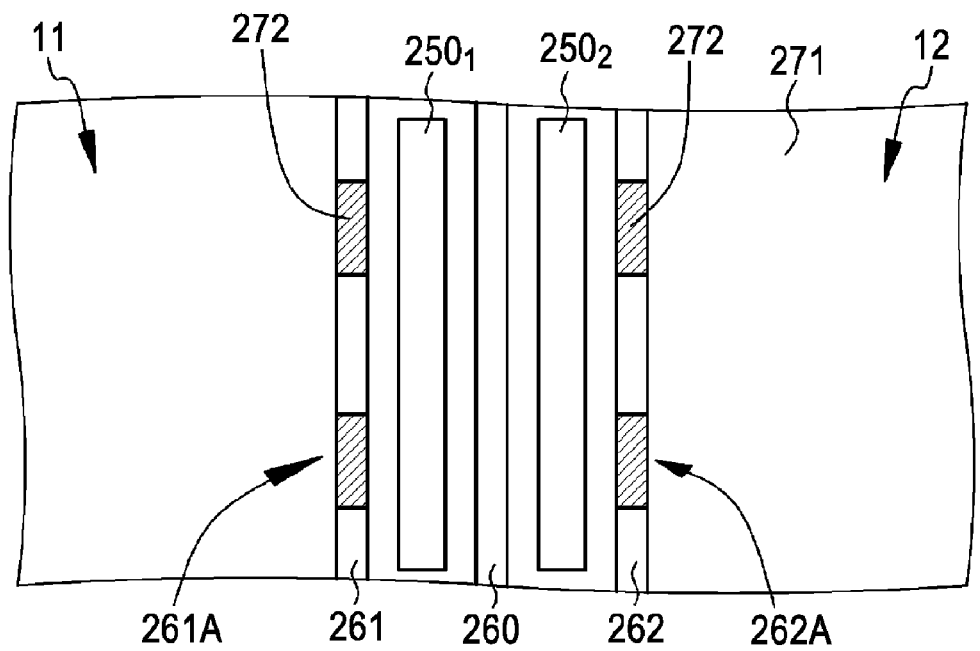

Subsequently, a SiO$_2$ layer 271 is formed over the entire surface by, for example, a CVD method. The SiO$_2$ layer 271 located on the second electrodes 250$_1$ and 250$_2$ is then removed by existing photolithography and etching techniques. As for the separation groove 260, the first recess 261, and the second recess 262, the SiO$_2$ layer 271 is formed only on the side faces and the bottom face of the separation groove 260, the first recess 261, and the second recess 262. Subsequently, a polyimide resin layer 272 is formed over the entire surface to fill the inside of the separation groove 260, and the insides of the first recess 261 and second recess 262. Subsequently, the polyimide resin layer 272 disposed inside the separation groove 260, unnecessary polyimide resin layer 272 disposed inside the first recess 261 and the second recess 262, and unnecessary polyimide resin layer 272 disposed on or above the second electrodes 250$_1$ and 250$_2$ and the contact layer 36 are removed. Accordingly, the discontinuous first recess 261 and second recess 262 having continuous portions 261A and 262A, respectively, in a part thereof can be obtained (see the schematic partial plan view of FIG. 8B). In FIG. 8B, in order to clearly show the polyimide resin layer 272 constituting the continuous portions 261A and 262A of the first recess 261 and the second recess 262, respectively, the polyimide resin layer 272 is shown by oblique lines.

Step-240

Subsequently, the second-electrode-extending portions 251 and 252 composed of Au/Pt/Ti (wherein the Au layer is a top layer and the Ti layer is the bottom layer) is formed on the second electrodes 250$_1$ and 250$_2$, the continuous portions 261A and 262A of the first recess 261 and the second recess 262, respectively, a first region 11, and a second region 12 by photolithography, sputtering, and etching techniques. Accordingly, the multi-beam semiconductor laser of the second embodiment shown in FIGS. 7A, 7B, and 7C can be obtained.

Step-250

Subsequently, Step-140 and Step 150 of the first embodiment are performed, thereby obtaining the multi-beam semiconductor laser of the second embodiment. Finally, the multi-beam semiconductor laser is mounted by a junction-up method.

Also in the multi-beam semiconductor lasers of the second embodiment and the third to fifth embodiments described below, when the pitch of the light-emitting portions is 30 µm, the difference in the amount of rotation of polarization between laser beams emitted from the edges of the light-emitting portions can be 20 degrees or less.

Third Embodiment

A third embodiment is also a modification of the first embodiment and relates to Structure 1C.

Figure 9A:
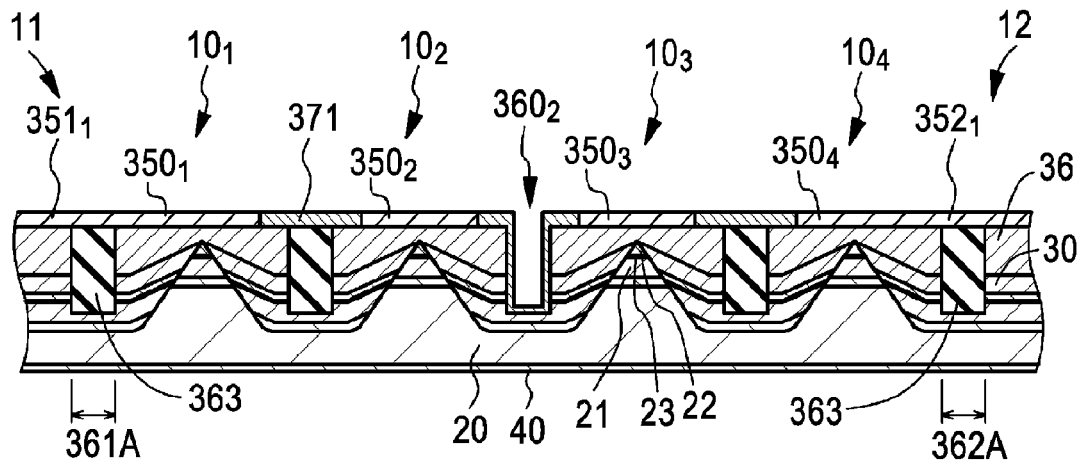
FIG. 9A is a schematic partial end view of an edge-emitting multi-beam semiconductor laser of a third embodiment taken along line IXA-IXA in FIG. 11B.
Figure 9B:
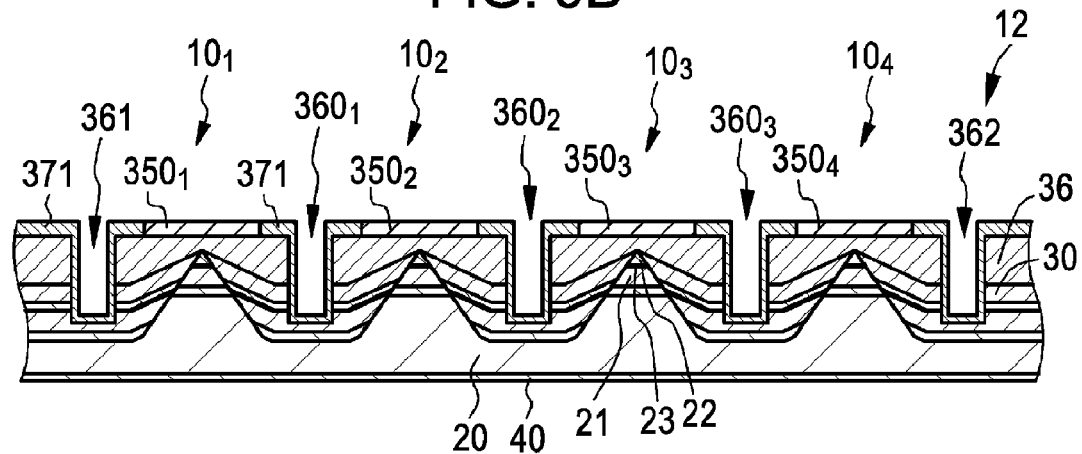
FIG. 9B is a schematic partial end view of the edge-emitting multi-beam semiconductor laser of the third embodiment taken along line IXB-IXB in FIG. 11B.
Figure 9C:
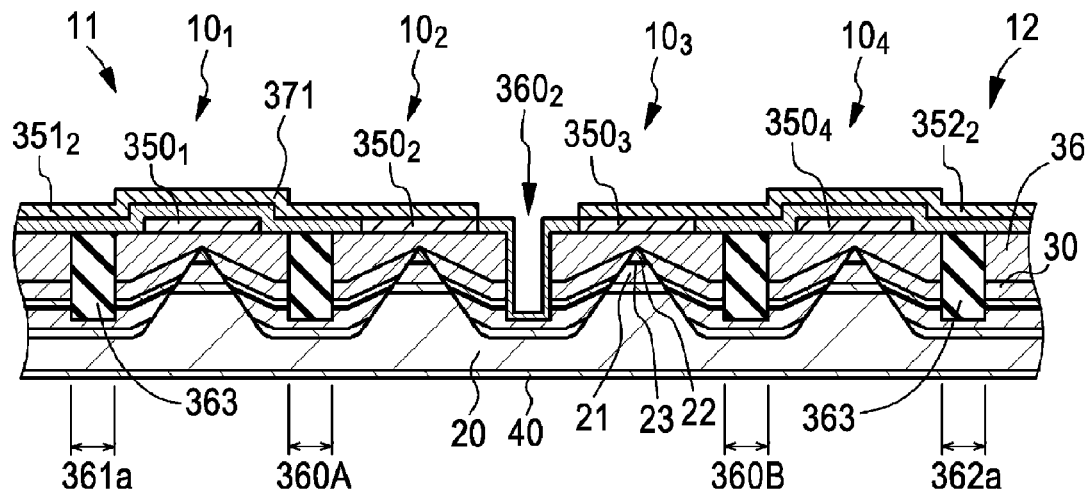
FIG. 9C is a schematic partial end view of the edge-emitting multi-beam semiconductor laser of the third embodiment taken along line IXC-IXC in FIG. 11B.
Figure 11A:
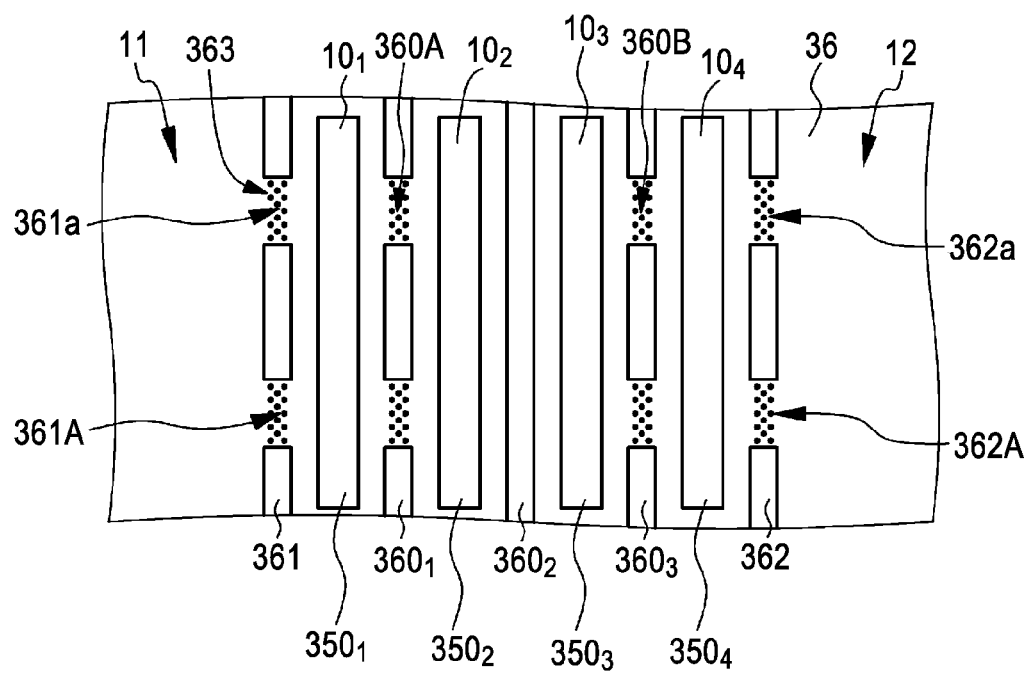
FIGS. 11A and 11B are schematic partial plan views illustrating the method of producing the edge-emitting multi-beam semiconductor laser of the third embodiment.
Figure 11B:
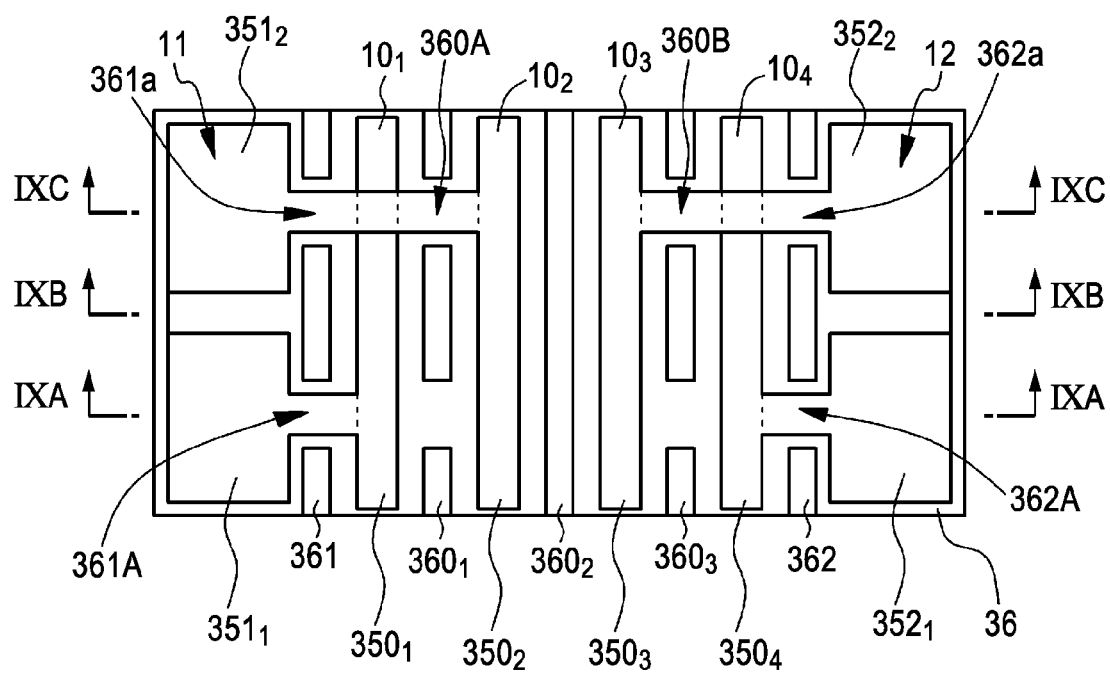

FIG. 11B is a schematic plan view of a multi-beam semiconductor laser of the third embodiment. FIG. 9A is a schematic partial end view taken along line IXA-IXA in FIG. 11B, FIG. 9B is a schematic partial end view taken along line IXB-IXB in FIG. 11B, and FIG. 9C is a schematic partial end view taken along line IXC-IXC in FIG. 11B. A schematic partial cross-sectional view of a light-emitting portion etc. of a multi-beam semiconductor laser having an SDH structure is shown in FIG. 2A, and an enlarged schematic partial cross-sectional view thereof is shown in FIG. 2B.

In the multi-beam semiconductor laser of the third embodiment, N≧3 (specifically, N=4). As in the first embodiment, a current block layer 32 is provided outside light-emitting portions 10 (10$_1$, 10$_2$, 10$_3$, and 10$_4$), three (=N−1) separation grooves 360$_1$, 360$_2$, and 360$_3$, a first recess 361, and a second recess 362 are provided in the current block layer 32. In the third embodiment, as in the first embodiment, continuous portions 361A and 361a of the first recess 361 and continuous portions 362A and 362a of the second recess 362, a continuous portion 360A of the separation groove 360$_1$, and a continuous portion 360B of the separation groove 360$_3$ are composed of the current block layer 32. The continuous portions 361A and 361a of the first recess 361, the continuous portions 362A and 362a of the second recess 362, the continuous portion 360A of the separation groove 360$_1$, and the continuous portion 360B of the separation groove 360$_3$ are formed as a high-resistance region or insulating region 363 by an ion implantation method or the like in order to electrically separate the light-emitting portions from each other.

Furthermore, in the multi-beam semiconductor laser of the third embodiment, second-electrode-extending portions 351$_2$ and 352$_2$ in the nth light-emitting portion (wherein 2≦n≦(N−1), and specifically, n=2 and 3) extend to a first region 11 disposed outside the first light-emitting portion 10$_1$ with the continuous portion 360A of the discontinuous separation groove 360$_1$ and the continuous portion 361a of the first recess 361 therebetween, or extend to a second region 12 disposed outside the Nth light-emitting portion 10$_N$ with the continuous portion 360B of the discontinuous separation groove 360$_3$ and the continuous portion 362a of the second recess 362 therebetween.

The multi-beam semiconductor laser of the third embodiment can be specifically produced by a method described below.

Step-300

First, the same steps as Step-100 to Step-110 of the first embodiment are performed.

Step-310

Figure 10A:
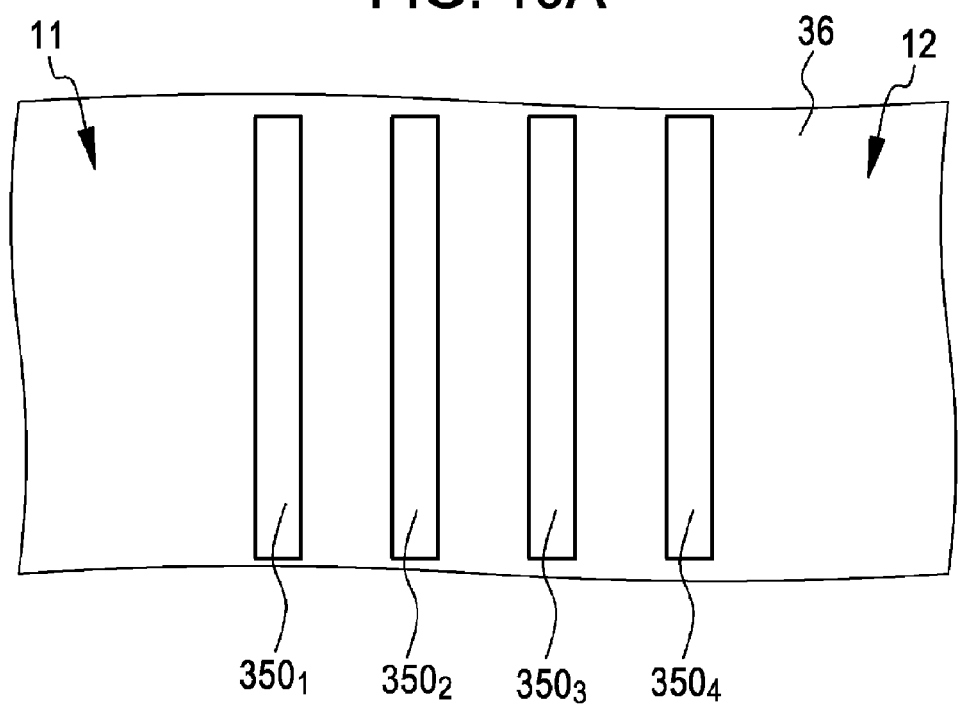
FIGS. 10A and 10B are schematic partial plan views illustrating a method of producing the edge-emitting multi-beam semiconductor laser of the third embodiment.

Subsequently, a second electrode layer is patterned by existing photolithography and etching techniques as in Step-120 of the first embodiment, thereby forming second electrodes 350$_1$, 350$_2$, 350$_3$, and 350$_4$ (see the schematic partial plan view of FIG. 10A). Unlike the first embodiment, second-electrode-extending portions 351$_1$, 351$_2$, 352$_1$, and 352$_2$ are not formed in this step.

Step-320

Figure 10B:
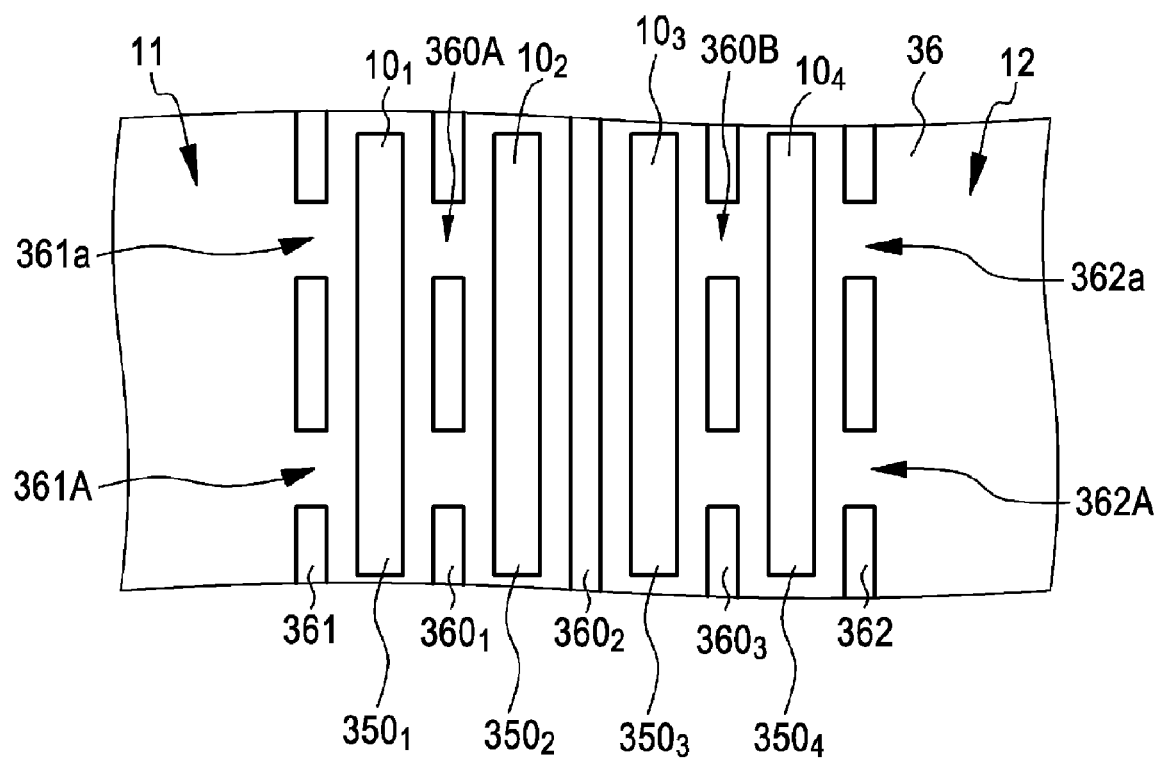

Subsequently, a contact layer 36 and a current block structure 30 are etched by existing photolithography and etching techniques as in Step-130 of the first embodiment, thereby forming separation grooves 360$_1$, 360$_2$, and 360$_3$, a first recess 361, and a second recess 362. Accordingly, light-emitting portions 10$_1$, 10$_2$, 10$_3$, and 10$_4$ are formed (see the schematic partial plan view of FIG. 10B). The first recess 361 includes continuous portions 361A and 361a in a part thereof, and the second recess 362 includes continuous portions 362A and 362a in a part thereof. The separation groove 360$_1$ includes a continuous portion 360A in a part thereof, and the separation groove 360$_3$ includes a continuous portion 360B in a part thereof.

Step-330

Next, a resist layer (not shown) in which the continuous portions 360A and 360B in the discontinuous separation grooves 360$_1$ and 360$_3$, respectively, the continuous portions 361A and 361a of the first recess 361, and the continuous portions 362A and 362a of the second recess 362 are opened is formed by a photolithography technique. A boron ion or a hydrogen ion is introduced by ion implantation into the continuous portions 360A and 360B in the discontinuous separation grooves 360$_1$ and 360$_3$, respectively, and the continuous portions 361A and 361a of the first recess 361, and the continuous portions 362A and 362a of the second recess 362, all of which are exposed through the openings. Accordingly, these portions 360A, 360B, 361A, 361a, 362A, and 362a are formed into a high-resistance region or insulating region 363. The depth of the ion implantation is determined such that the light-emitting portions can be reliably electrically separated from each other. The resist layer is then removed. As a result, the structure shown in the schematic partial plan view of FIG. 11A can be obtained.

Step-340

Subsequently, a $SiO_2$ layer 371 is formed over the entire surface by, for example, a CVD method. The $SiO_2$ layer 371 located on the second electrodes $350_1$, $350_2$, $350_3$, and $350_4$ is then removed by existing photolithography and etching techniques. As for the separation grooves $360_1$, $360_2$, and $360_3$, the first recess 361, and the second recess 362, the $SiO_2$ layer 371 is formed only on the side faces and the bottom face of the separation grooves $360_1$, $360_2$, and $360_3$, the first recess 361, and the second recess 362. The second-electrode-extending portion $351_1$ is then formed so as to extend from the second electrode $350_1$ to the first region 11 with the continuous portion 361A of the first recess 361 therebetween as in Step-240 of the second embodiment. At the same time, the second-electrode-extending portion $351_2$ is formed so as to extend from the second electrode $350_2$ to the first region 11 with the continuous portion 360A of the separation groove $360_1$, the upper portion of the second electrode $350_1$, and the continuous portion 361a of the first recess 361 therebetween as in Step-240 of the second embodiment. At the same time, the second-electrode-extending portion $352_2$ is formed so as to extend from the second electrode $350_3$ to the second region 12 with the continuous portion 360B of the separation groove $360_3$, the upper portion of the second electrode $350_4$, and the continuous portion 362a of the second recess 362 therebetween as in Step-240 of the second embodiment. At the same time, the second-electrode-extending portion $352_1$ is formed so as to extend from the second electrode $350_4$ to the second region 12 with the continuous portion 362A of the second recess 362 therebetween as in Step-240 of the second embodiment. Accordingly, the multi-beam semiconductor laser of the third embodiment, which is shown in the schematic partial plan view of FIG. 11B and in the schematic partial end views of FIGS. 9A, 9B, and 9C, can be obtained.

Step-350

Subsequently, Step-140 and Step 150 of the first embodiment are performed, thus obtaining the multi-beam semiconductor laser of the third embodiment. Finally, the multi-beam semiconductor laser is mounted by a junction-up method.

Fourth Embodiment

A fourth embodiment is also a modification of the first embodiment and relates to Structure 1D.

Figure 12A:
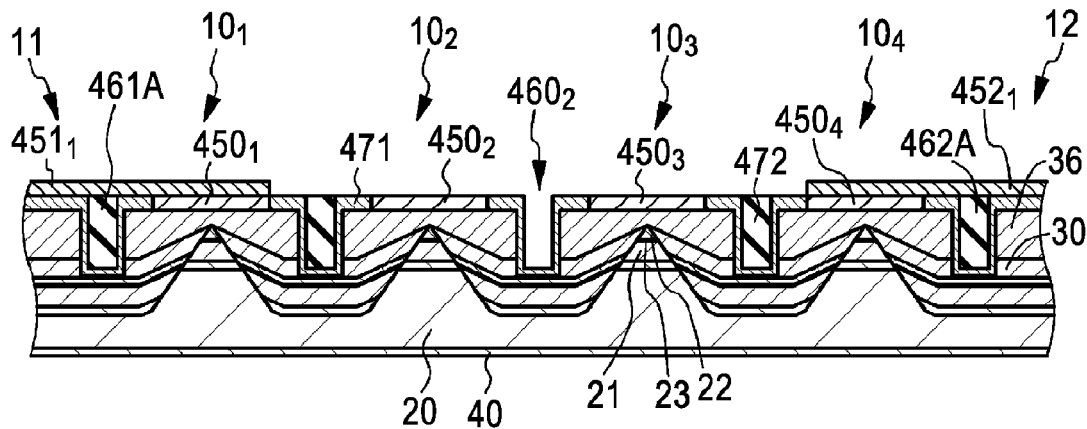
FIG. 12A is a schematic partial end view of an edge-emitting multi-beam semiconductor laser of a fourth embodiment taken along line XIIA-XIIA in FIG. 14B.
Figure 12B:
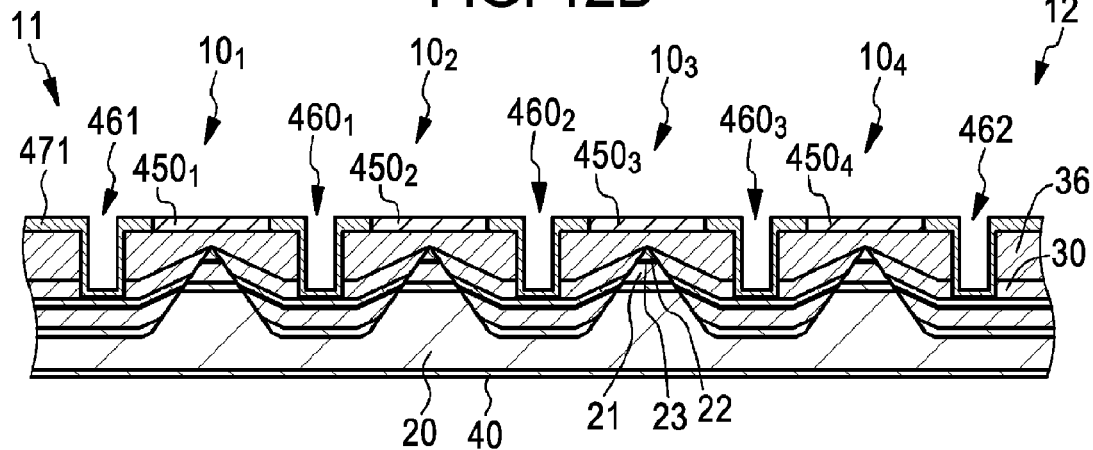
FIG. 12B is a schematic partial end view of the edge-emitting multi-beam semiconductor laser of the fourth embodiment taken along line XIIB-XIIB in FIG. 14B.
Figure 12C:
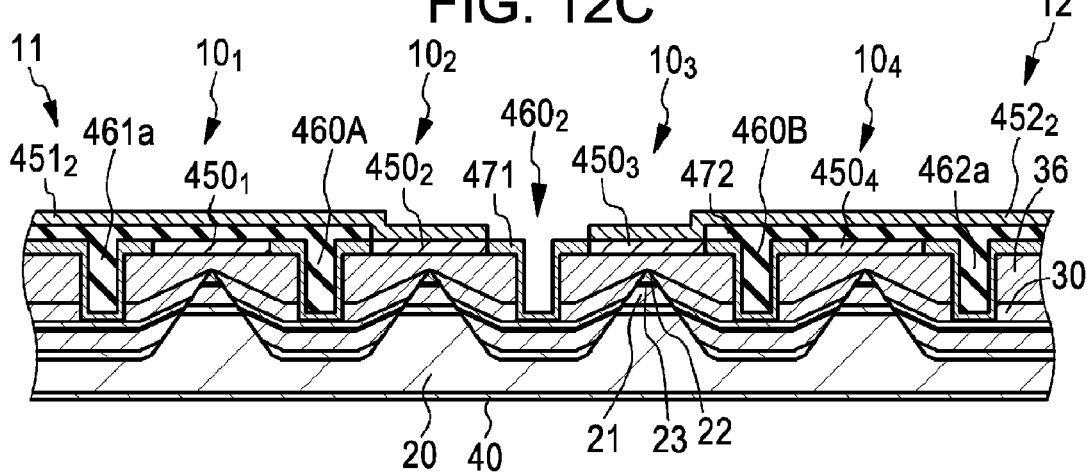
FIG. 12C is a schematic partial end view of the edge-emitting multi-beam semiconductor laser of the fourth embodiment taken along line XIIC-XIIC in FIG. 14B.
Figure 14A:
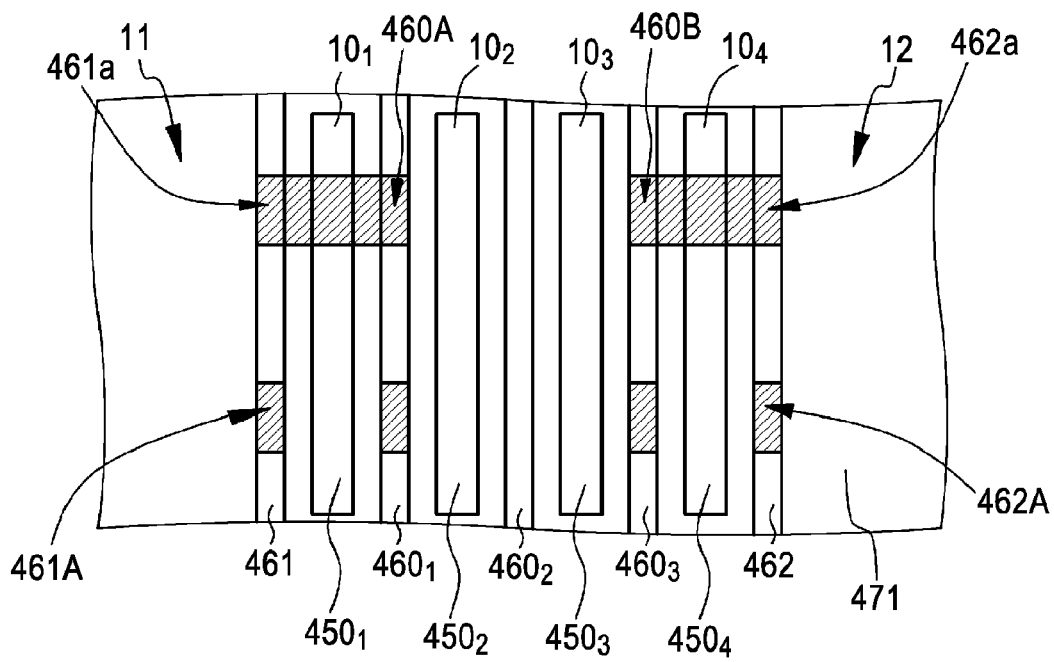
FIGS. 14A and 14B are schematic partial plan views illustrating the method of producing the edge-emitting multi-beam semiconductor laser of the fourth embodiment.
Figure 14B:
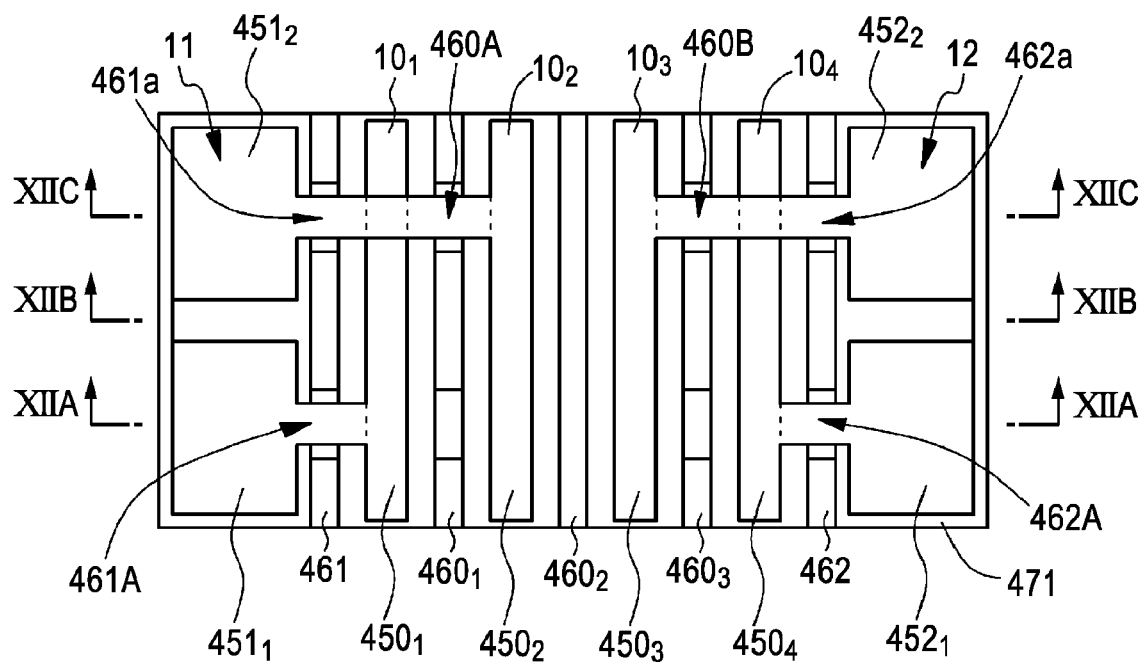

FIG. 14B is a schematic plan view of a multi-beam semiconductor laser of the fourth embodiment. FIG. 12A is a schematic partial end view taken along line XIIA-XIIA in FIG. 14B, FIG. 12B is a schematic partial end view taken along line XIIB-XIIB in FIG. 14B, and FIG. 12C is a schematic partial end view taken along line XIIC-XIIC in FIG. 14B. A schematic partial cross-sectional view of a light-emitting portion etc. of a multi-beam semiconductor laser having an SDH structure is shown in FIG. 2A, and an enlarged schematic partial cross-sectional view thereof is shown in FIG. 2B.

In the multi-beam semiconductor laser of the fourth embodiment, $N \geq 3$ (specifically, N=4). As in the first embodiment, a current block layer 32 is provided outside light-emitting portions 10 ($10_1$, $10_2$, $10_3$, and $10_4$), three (=N−1) separation grooves $460_1$, $460_2$, and $460_3$, a first recess 461, and a second recess 462 are provided in the current block layer 32. In the fourth embodiment, as in the second embodiment, continuous portions 461A and 461a of the first recess 461 and continuous portions 462A and 462a of the second recess 462, a continuous portion 460A of the separation groove $460_1$, and a continuous portion 460B of the separation groove $460_3$ are composed of an insulating material layer. Here, the insulating material layer is specifically composed of a $SiO_2$ layer 471 and a polyimide resin layer 472.

Specifically, the multi-beam semiconductor laser of the fourth embodiment can be produced by a method described below.

Step-400

First, the same steps as Step-100 to Step-110 of the first embodiment are performed.

Step-410

Figure 13A:
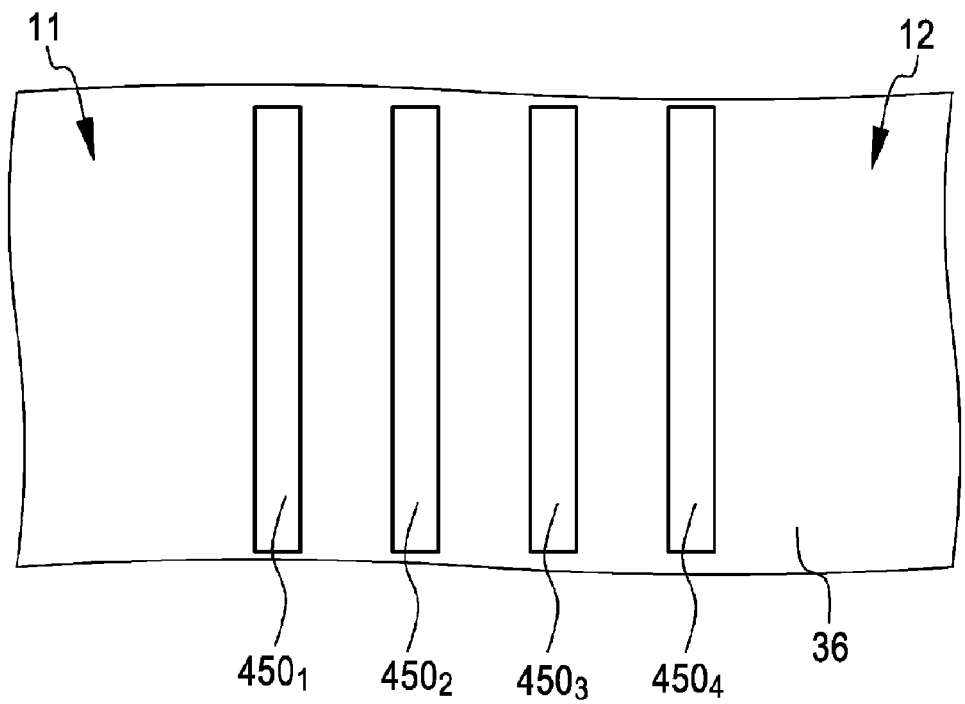
FIGS. 13A and 13B are schematic partial plan views illustrating a method of producing the edge-emitting multi-beam semiconductor laser of the fourth embodiment.

Subsequently, a second electrode layer is patterned by existing photolithography and etching techniques as in Step-120 of the first embodiment, thereby forming second electrodes $450_1$, $450_2$, $450_3$, and $450_4$ (see the schematic partial plan view of FIG. 13A). Unlike the first embodiment, second-electrode-extending portions $451_1$, $451_2$, $452_1$, and $452_2$ are not formed in this step.

Step-420

Figure 13B:
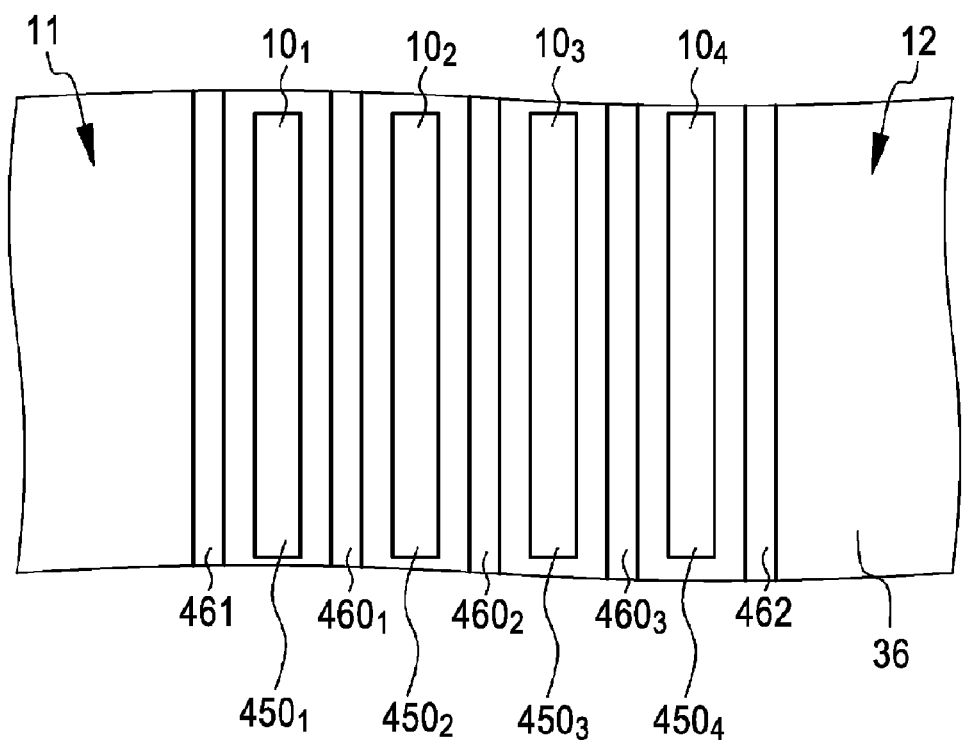

Subsequently, a contact layer 36 and a current block structure 30 are etched by existing photolithography and etching techniques as in Step-130 of the first embodiment, thereby forming separation grooves $460_1$, $460_2$, and $460_3$, a first recess 461, and a second recess 462. Accordingly, light-emitting portions $10_1$, $10_2$, $10_3$, and $10_4$ are formed (see the schematic partial plan view of FIG. 13B).

Step-430

Subsequently, a $SiO_2$ layer 471 is formed over the entire surface by, for example, a CVD method. The $SiO_2$ layer 471 located on the second electrodes $450_1$, $450_2$, $450_3$, and $450_4$ is then removed by existing photolithography and etching techniques. As for the separation grooves $460_1$, $460_2$, and $460_3$, the first recess 461, and the second recess 462, the $SiO_2$ layer 471 is formed only on the side faces and the bottom face of the separation grooves $460_1$, $460_2$, and $460_3$, the first recess 461, and the second recess 462. Subsequently, a polyimide resin layer 472 is formed over the entire surface to fill the insides of the separation grooves $460_1$, $460_2$, and $460_3$, and the insides of the first recess 461 and second recess 462. Subsequently, unnecessary polyimide resin layer 472 disposed inside the separation grooves $460_1$, $460_2$, and $460_3$, unnecessary polyimide resin layer 472 disposed inside the first recess 461 and the second recess 462, and unnecessary polyimide resin layer 472 disposed on or above the second electrodes $450_1$, $450_2$, $450_3$, and $450_4$, and the contact layer 36 are removed. Accordingly, the discontinuous first recess 461 having continuous portions 461A and 461a in a part thereof, the discontinuous second recess 462 having continuous portions 462A and 462a in a part thereof, the separation groove $460_1$ having the continuous portion 460A in a part thereof, and the separation groove $460_3$ having the continuous portion 460B in a part thereof can be obtained (see the schematic partial plan view of FIG. 14A). In FIG. 14A, in order to clearly show the remaining polyimide resin layer 472, the polyimide resin layer 472 is shown by oblique lines.

Subsequently, the second-electrode-extending portion $451_1$ is formed so as to extend from the second electrode $450_1$ to the first region 11 with the continuous portion 461A of the first recess 461 therebetween as in Step-240 of the second embodiment. At the same time, the second-electrode-extending portion $451_2$ is formed so as to extend from the second electrode 450₂ to the first region 11 with the continuous portion 460A of the separation groove 460₁, the upper portion of the second electrode 450₁, and the continuous portion 461a of the first recess 461 therebetween as in Step-240 of the second embodiment. At the same time, the second-electrode-extending portion 452₂ is formed so as to extend from the second electrode 450₃ to the second region 12 with the continuous portion 460B of the separation groove 460₃, the upper portion of the second electrode 450₄, and the continuous portion 462a of the second recess 462 therebetween as in Step-240 of the second embodiment. At the same time, the second-electrode-extending portion 452₁ is formed so as to extend from the second electrode 450₄ to the second region 12 with the continuous portion 462A of the second recess 462 therebetween as in Step-240 of the second embodiment. Accordingly, the multi-beam semiconductor laser of the fourth embodiment, which is shown in the schematic partial plan view of FIG. 14B and in the schematic partial end views of FIGS. 12A, 12B, and 12C, can be obtained.

Subsequently, Step-140 and Step 150 of the first embodiment are performed, thus obtaining the multi-beam semiconductor laser of the fourth embodiment. Finally, the multi-beam semiconductor laser is mounted by a junction-up method.

Fifth Embodiment

Figure 15A:
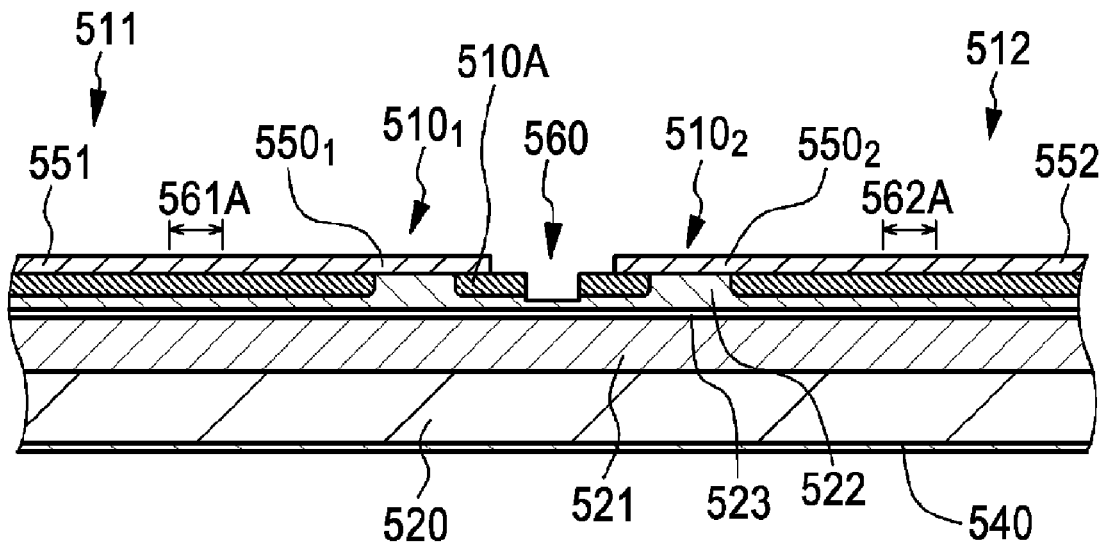
FIG. 15A is a schematic partial end view of an edge-emitting multi-beam semiconductor laser of a fifth embodiment similar to the view taken along line IB-IB in FIG. 1A.
Figure 15B:
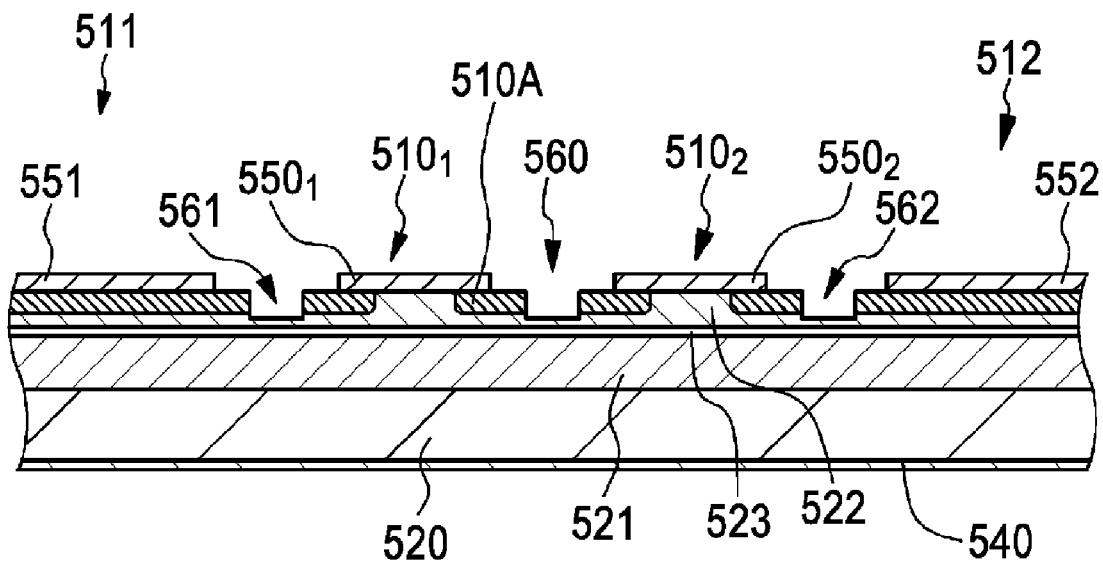
FIG. 15B is a schematic partial end view of the edge-emitting multi-beam semiconductor laser of the fifth embodiment similar to the view taken along line IC-IC in FIG. 1A.

A fifth embodiment is a modification of the first embodiment but has a stripe structure. Furthermore, the fifth embodiment has Structure 2A. FIGS. 15A and 15B are schematic partial end views of a multi-beam semiconductor laser of the fifth embodiment. A schematic plan view of the multi-beam semiconductor laser of the fifth embodiment is similar to that shown in FIG. 1A. FIG. 15A is a schematic partial end view similar to the view taken along line IB-IB in FIG. 1A, and FIG. 15B is a schematic partial end view similar to the view taken along line IC-IC in FIG. 1A.

In the multi-beam semiconductor laser of the fifth embodiment, N is 2. A non-conducting region 510A composed of at least a second compound semiconductor layer 522 is provided outside light-emitting portions 510₁ and 510₂. A separation groove 560, a first recess 561, and a second recess 562 are provided in the non-conducting region 510A. In addition, a continuous portion 561A of the first recess 561 and a continuous portion 562A of the second recess 562 are composed of the non-conducting region 510A. Furthermore, a first region 511 and a second region 512 are composed of the non-conducting region 510A constituted by at least the second compound semiconductor layer 522. The non-conducting region 510A is formed by, for example, a method of introducing a boron ion or a hydrogen ion into the second compound semiconductor layer 522 by ion implantation or a method of embedding such an ion by an epitaxial growth method. That is, the non-conducting region 510A is a region for constricting a current that flows to an active layer 523. The multi-beam semiconductor laser of this embodiment includes a substrate 520, a first compound semiconductor layer 521, and a first electrode 540. The multi-beam semiconductor laser further includes second electrodes 550₁ and 550₂ and second-electrode-extending portions 551 and 552.

The configuration and the structure other than the light-emitting portions 510 of the fifth embodiment can be the same as those of the multi-beam semiconductor laser of the first embodiment. Accordingly, a detailed description of the multi-beam semiconductor laser of the fifth embodiment is omitted. Finally, the multi-beam semiconductor laser is mounted by a junction-up method.

Alternatively, Structure 2B described below can also be provided. Specifically, in Structure 2B, N=2; a non-conducting region composed of at least a second compound semiconductor layer is provided outside light-emitting portions; a separation groove, a first recess, and a second recess are provided in the non-conducting region; and continuous portions of the first recess and the second recess are composed of an insulating material layer. In this structure, the configuration and the structure other than the light-emitting portions can be the same as those of the multi-beam semiconductor laser of the second embodiment. Accordingly, a detailed description thereof is omitted.

Alternatively, Structure 2C described below can also be provided. Specifically, in Structure 2C, N≧3; a non-conducting region composed of at least a second compound semiconductor layer is provided outside light-emitting portions; separation grooves, a first recess, and a second recess are provided in the non-conducting region; and continuous portions of the first recess and the second recess, and continuous portions of the separation grooves are composed of the non-conducting region. In this structure, the configuration and the structure other than the light-emitting portions can be the same as those of the multi-beam semiconductor laser of the third embodiment. Accordingly, a detailed description thereof is omitted.

Alternatively, Structure 2D described below can also be provided. Specifically, in Structure 2D, N≧3; a non-conducting region composed of at least a second compound semiconductor layer is provided outside light-emitting portions; separation grooves, a first recess, and a second recess are provided in the non-conducting region; and continuous portions of the first recess and the second recess, and continuous portions of the separation grooves are composed of an insulating material layer. In this structure, the configuration and the structure other than the light-emitting portions can be the same as those of the multi-beam semiconductor laser of the fourth embodiment. Accordingly, a detailed description thereof is omitted.

The present invention has been described on the basis of preferred embodiments, but the present invention is not limited to these embodiments. The configuration and the structure of the multi-beam semiconductor laser, the materials constituting the multi-beam semiconductor laser, and production conditions and various numerical values of the multi-beam semiconductor laser described in the embodiments are exemplifications and can be appropriately changed. For example, in the multi-beam semiconductor laser described in the embodiments, a multi-beam semiconductor laser provided on a substrate is described as a final form of the multi-beam semiconductor laser. Alternatively, the substrate may be removed by grinding or etching, and the first electrode 40 may be formed on the exposed first compound semiconductor layer 21. In the embodiments, the first conductivity type is an n-type, and the second conductivity type is a p-type. Alternatively, the first conductivity type may be a p-type, and the second conductivity type may be an n-type. In addition, in the fourth embodiment and a modification of the fifth embodiment in accordance with the fourth embodiment, a part of the continuous portions of the separation grooves and a part of the continuous portions of the recesses may be composed of the current block layer or the non-conducting region.

It should be understood by those skilled in the art that various modifications, combinations, sub-combinations and alterations may occur depending on design requirements and other factors insofar as they are within the scope of the appended claims or the equivalents thereof.

What is claimed is:

1. An edge-emitting multi-beam semiconductor laser comprising juxtaposed stripe-shaped light-emitting portions the number of which is N,
wherein,
N≧3;
each of the light-emitting portions includes
(a) a first compound semiconductor layer of a first conductivity type,
(b) an active layer disposed on the first compound semiconductor layer,
(c) a second compound semiconductor layer of a second conductivity type different from the first conductivity type, the second compound semiconductor layer being disposed on the active layer,
(d) a first electrode that is electrically connected to the first compound semiconductor layer,
(e) a second electrode disposed on the second compound semiconductor layer, and
(f) a second-electrode-extending portion extending from the second electrode;
the first electrode in the light-emitting portions, the number of which is N, is commonly provided to the light-emitting portions, the number of which is N;
at least one separation groove that electrically separates the light-emitting portions from each other is provided between the light-emitting portions;
a first recess that is partly discontinuous is provided outside a first light-emitting portion;
a second recess that is partly discontinuous is provided outside an Nth light-emitting portion;
the second-electrode-extending portion in the first light-emitting portion extends to a first region disposed outside the first light-emitting portion with a continuous portion of the first recess therebetween;
the second-electrode-extending portion in the Nth light-emitting portion extends to a second region disposed outside the Nth light-emitting portion with a continuous portion of the second recess therebetween; and
the second-electrode-extending portion in an nth light-emitting portion (wherein 2≦n≦(N−1)) extends to the first region disposed outside the first light-emitting portion with a continuous portion of one of the at least one discontinuous separation groove and a continuous portion of the first recess therebetween or extends to the second region disposed outside the Nth light-emitting portion with a continuous portion of one of the at least one discontinuous separation groove and a continuous portion of the second recess therebetween.

2. The multi-beam semiconductor laser according to claim 1, wherein the multi-beam semiconductor laser has a separated double heterojunction (SDH) structure.

3. The multi-beam semiconductor laser according to claim 2, wherein
a current block layer is provided outside each of the light-emitting portions,
the separation groove, the first recess, and the second recess penetrate through the current block layer, and
the continuous portion of the first recess, the continuous portion of the second recess, and the continuous portion of the separation groove are composed of the current block layer.

4. The multi-beam semiconductor laser according to claim 2, wherein
a current block layer is provided outside each of the light-emitting portions,
the separation groove, the first recess, and the second recess penetrate through the current block layer, and
the continuous portion of the first recess, the continuous portion of the second recess, and the continuous portion of the separation groove are composed of an insulating material layer.

5. The multi-beam semiconductor laser according to claim 2, wherein the first Region and the second region are composed of a current block layer.

6. The multi-beam semiconductor laser according to claim 1, wherein
a non-conducting region composed of at least the second compound semiconductor layer is provided outside each of the light-emitting portions,
the separation groove, the first recess, and the second recess are provided in the non-conducting region, and
the continuous portion of the first recess, the continuous portion of the second recess, and the continuous portion of the separation groove are composed of the non-conducting region.

7. The multi-beam semiconductor laser according to claim 1, wherein
a non-conducting region composed of at least the second compound semiconductor layer is provided outside each of the light-emitting portions,
the separation groove, the first recess, and the second recess are provided in the non-conducting region, and
the continuous portion of the first recess, the continuous portion of the second recess, and the continuous portion of the separation groove are composed of an insulating material layer.

8. The multi-beam semiconductor laser according to any one of claims 6 to 7, wherein the first region and the second region are composed of the non-conducting region constituted by at least the second compound semiconductor layer.

9. The multi-beam semiconductor laser according to claim 1, wherein the difference in the amount of rotation of polarization between light components emitted from edges of the light-emitting portions is 20 degrees or less.

10. The multi-beam semiconductor laser according to claim 1, wherein the pitch of the juxtaposed light-emitting portions is 90 μm or less.

* * * * *